US012568638B2

(12) United States Patent
Harada et al.

(10) Patent No.: US 12,568,638 B2
(45) Date of Patent: Mar. 3, 2026

(54) SEMICONDUCTOR DEVICE AND POWER CONVERSION APPARATUS

(71) Applicant: Mitsubishi Electric Corporation, Tokyo (JP)

(72) Inventors: Kenji Harada, Tokyo (JP); Shinya Soneda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 429 days.

(21) Appl. No.: 18/177,021

(22) Filed: Mar. 1, 2023

(65) Prior Publication Data

US 2023/0343862 A1 Oct. 26, 2023

(30) Foreign Application Priority Data

Apr. 26, 2022 (JP) ................................. 2022-072318

(51) Int. Cl.
*H10D 12/00* (2025.01)
*H10D 8/00* (2025.01)
*H10D 64/27* (2025.01)

(52) U.S. Cl.
CPC ............. *H10D 12/481* (2025.01); *H10D 8/00* (2025.01); *H10D 64/513* (2025.01)

(58) Field of Classification Search
CPC .. H10D 12/481; H10D 64/513; H10D 62/127; H10D 8/00; H10D 8/422; H10D 62/129
See application file for complete search history.

(56) References Cited

U.S. PATENT DOCUMENTS

| | | | |
|---|---|---|---|
| 2008/0048295 A1* | 2/2008 | Takahashi | H10D 8/00 257/E21.384 |
| 2021/0043758 A1 | 2/2021 | Yokoyama et al. | |
| 2021/0082778 A1* | 3/2021 | Kaji | H02M 7/003 |

FOREIGN PATENT DOCUMENTS

JP 2021-028930 A 2/2021

* cited by examiner

*Primary Examiner* — Wasiul Haider
(74) *Attorney, Agent, or Firm* — Studebaker Brackett PLLC

(57) ABSTRACT

A semiconductor device has an alternating region in which insulated gate bipolar transistor (IGBT) regions and diode regions are alternately arranged linearly in a plan view. In the alternating region, a width, in the first direction, of an IGBT region closest to the center of a cell region is equal to or smaller than widths of other IGBT regions in the first direction, and a width, in the first direction, of a diode region closest to a center of the cell region is equal to or smaller than widths of other diode regions in the first direction.

15 Claims, 26 Drawing Sheets

110

F I G.  1
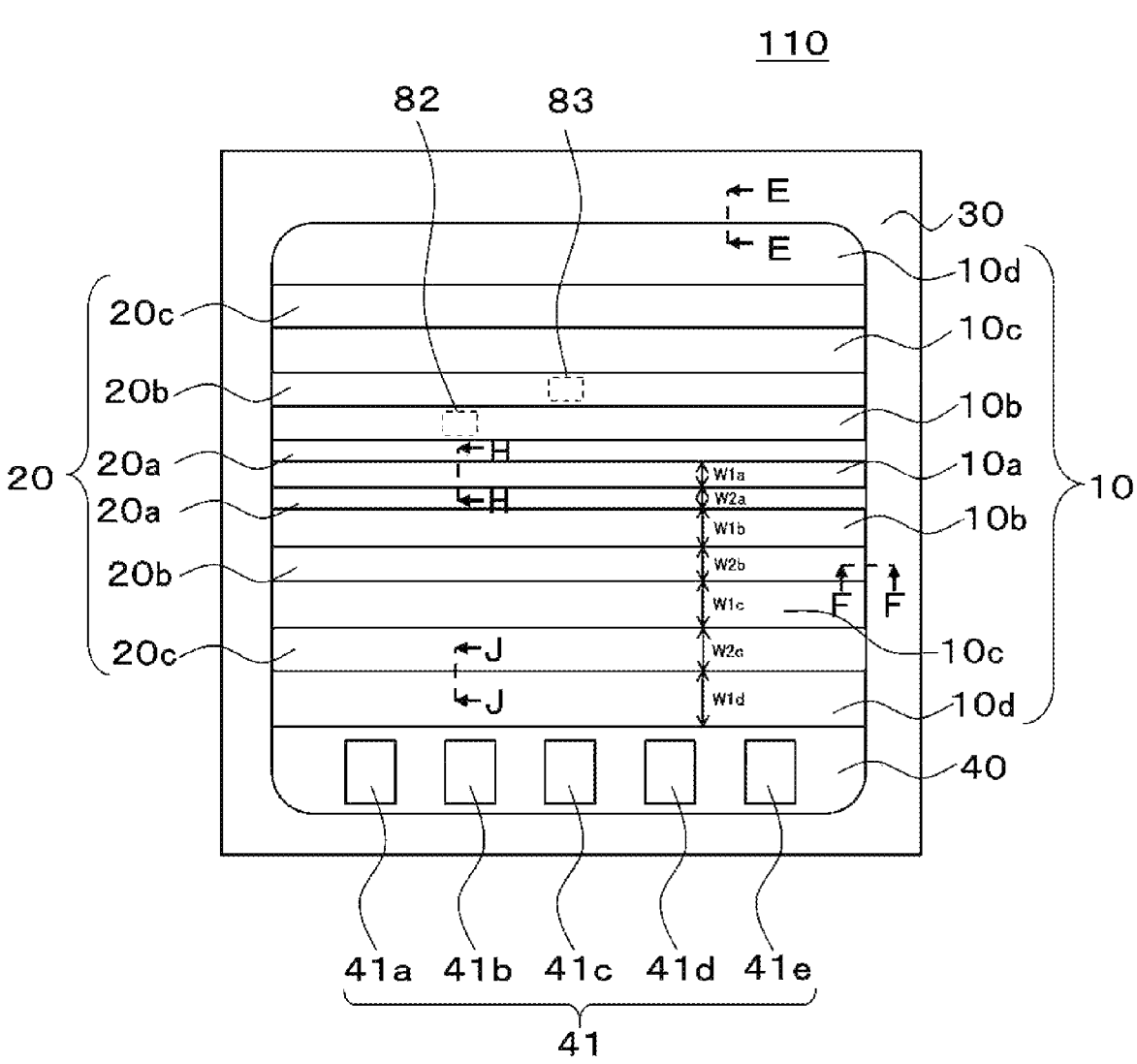

F I G. 2
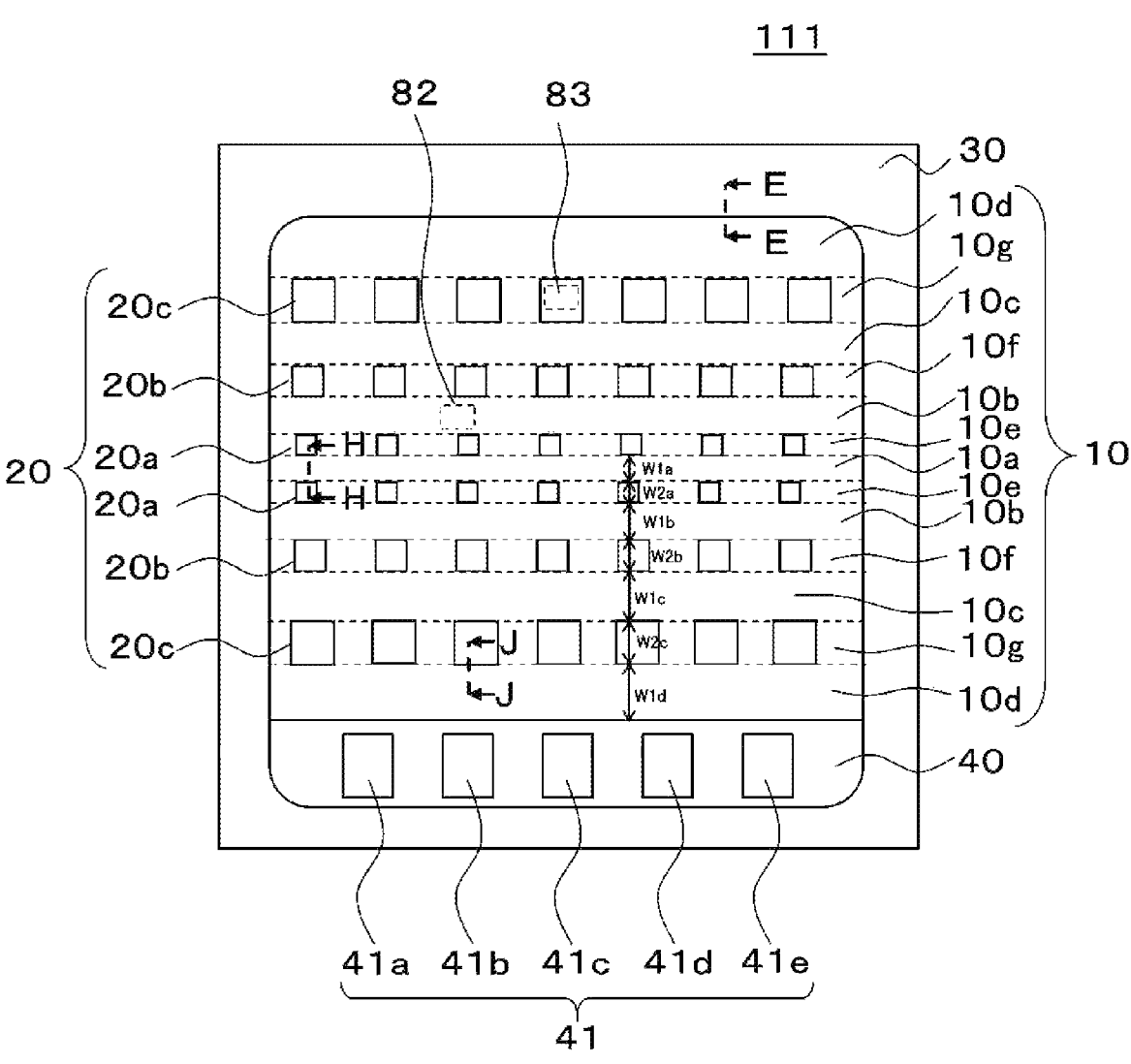

F I G.  3
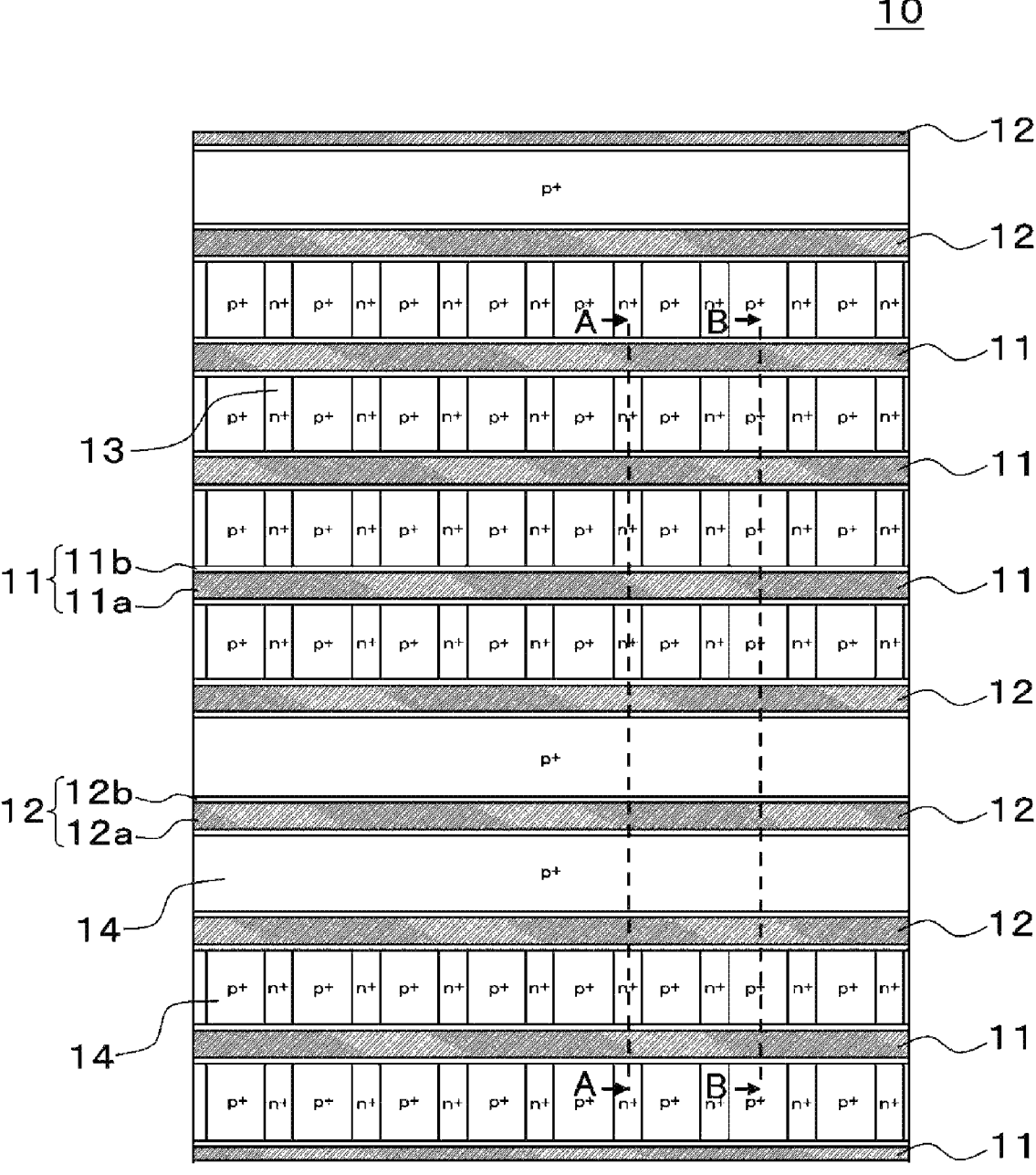

F I G.  4
A-A CROSS SECTION
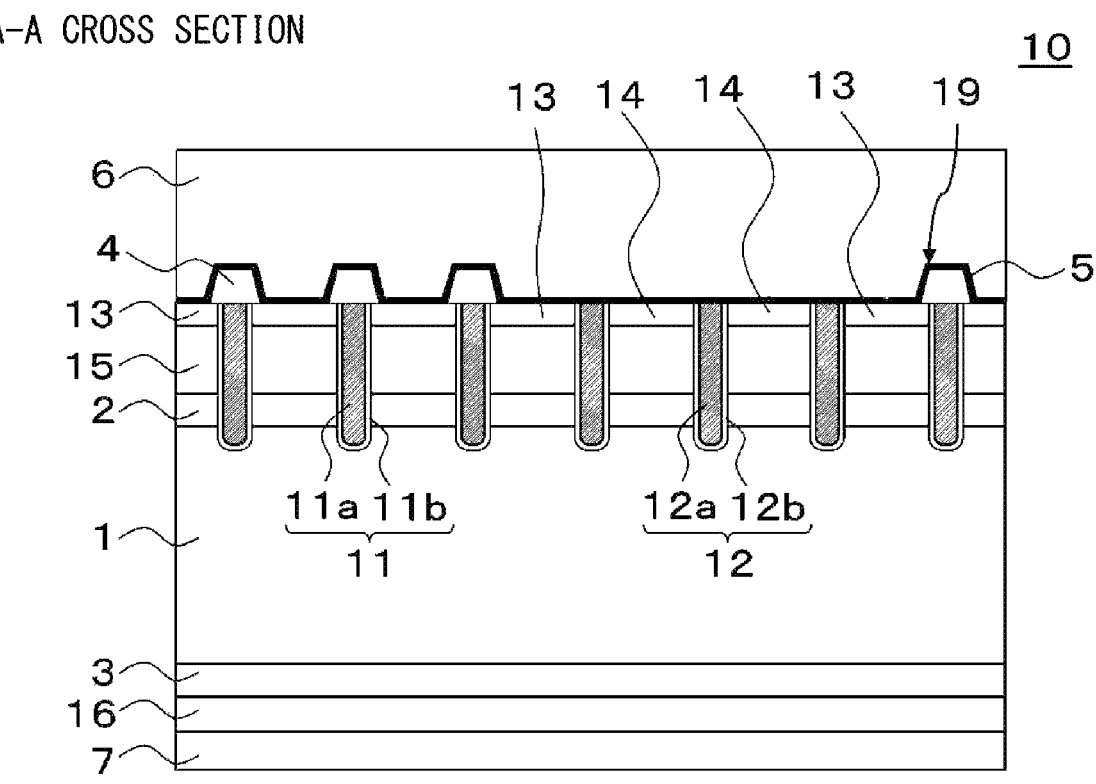

F I G.  5
B-B CROSS SECTION
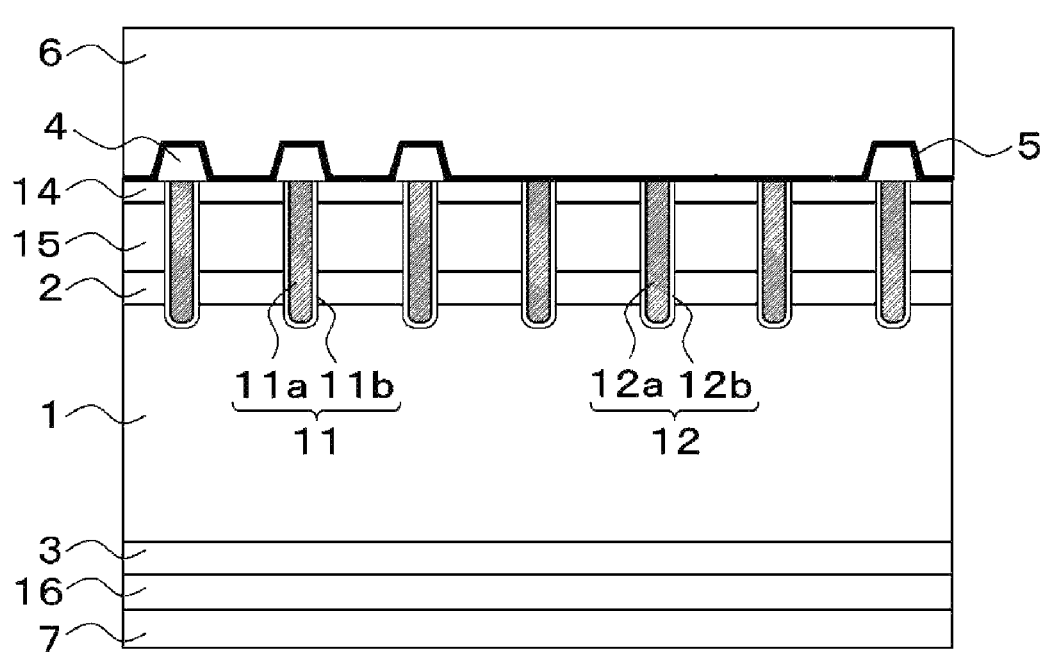

F I G. 6
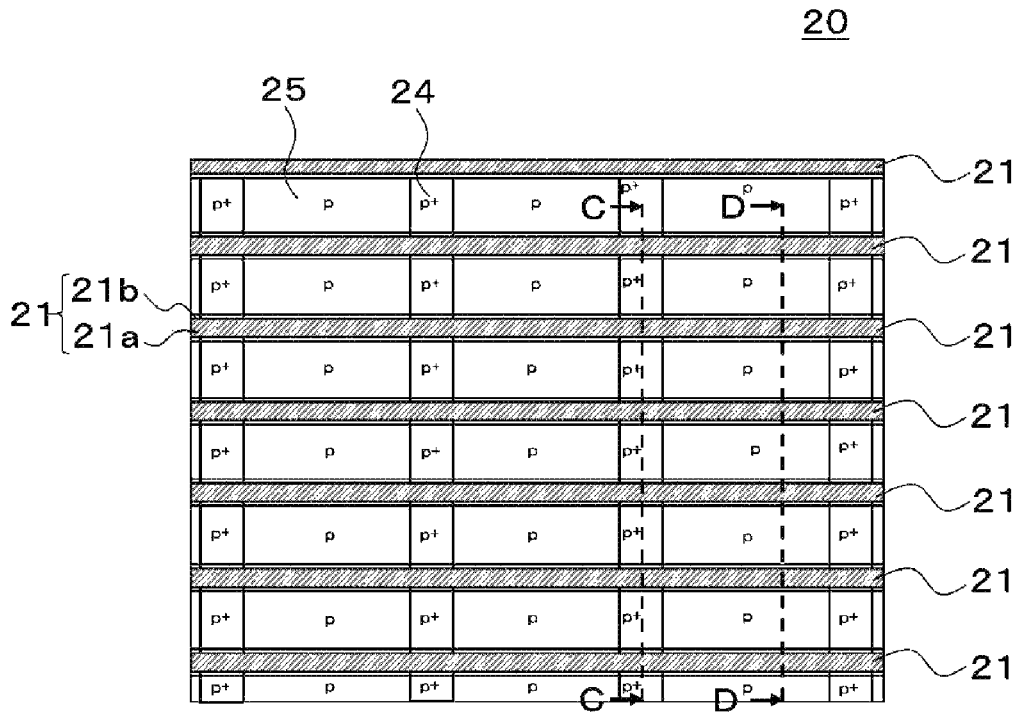

F I G.   7
C-C CROSS SECTION
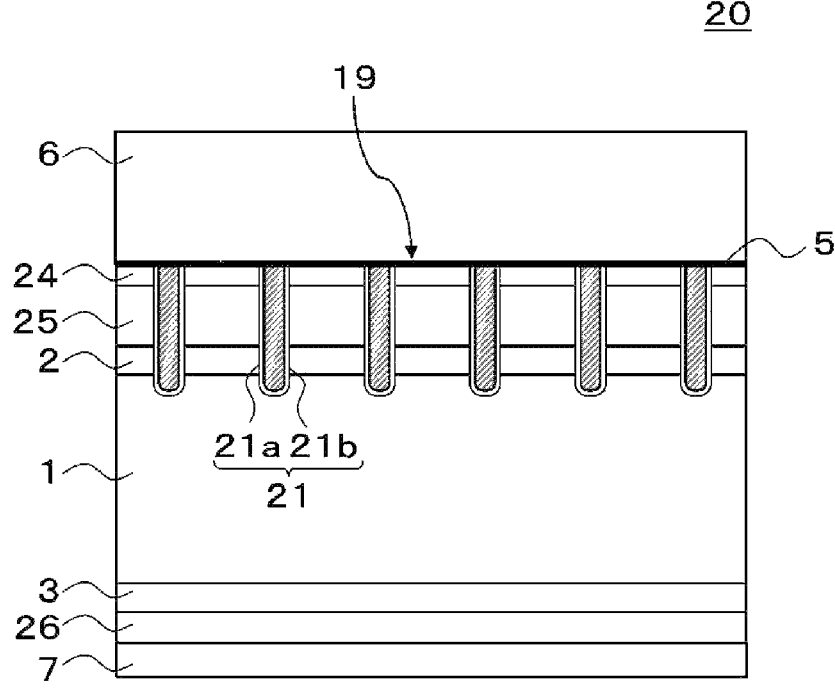

F I G. 8
D-D CROSS SECTION
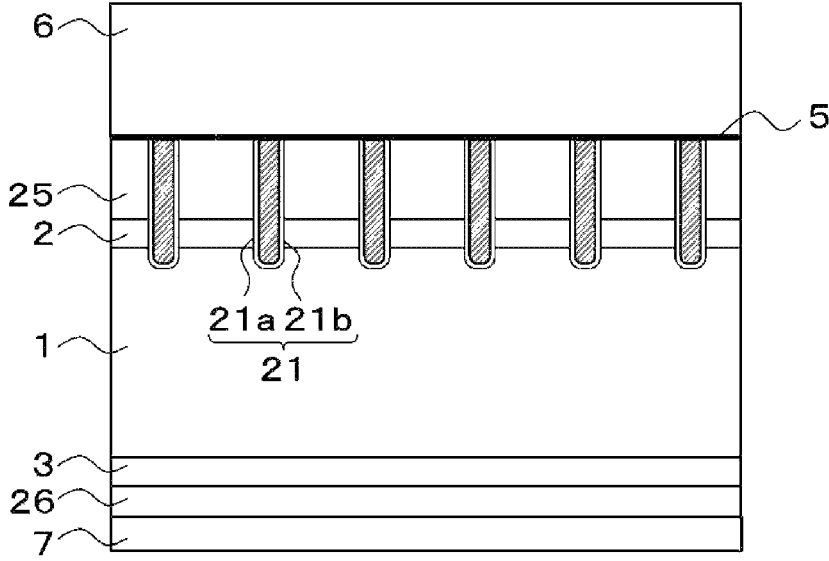

F I G.  9 A
E-E CROSS SECTION
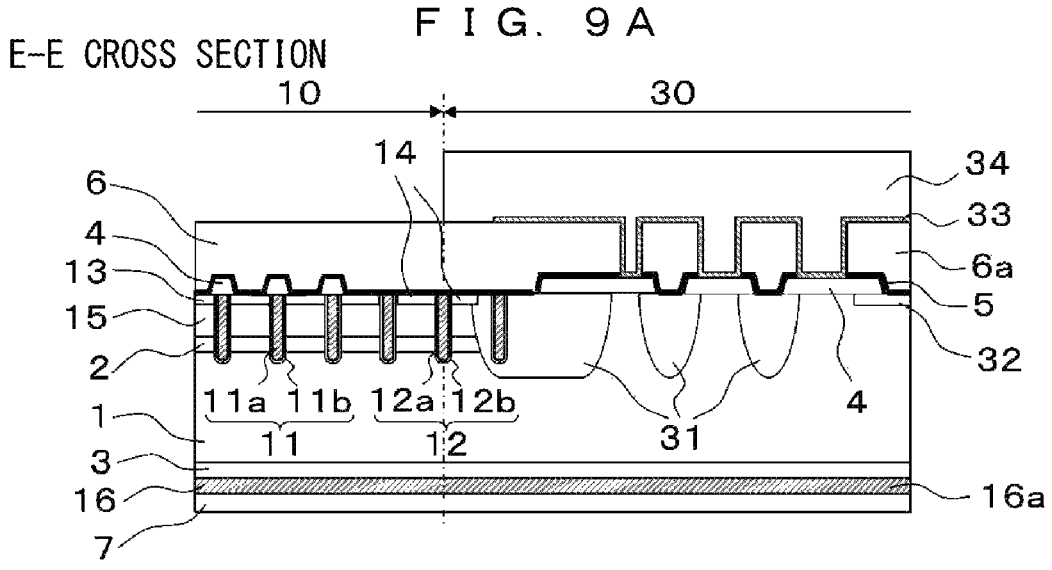
F I G.  9 B
F-F CROSS SECTION
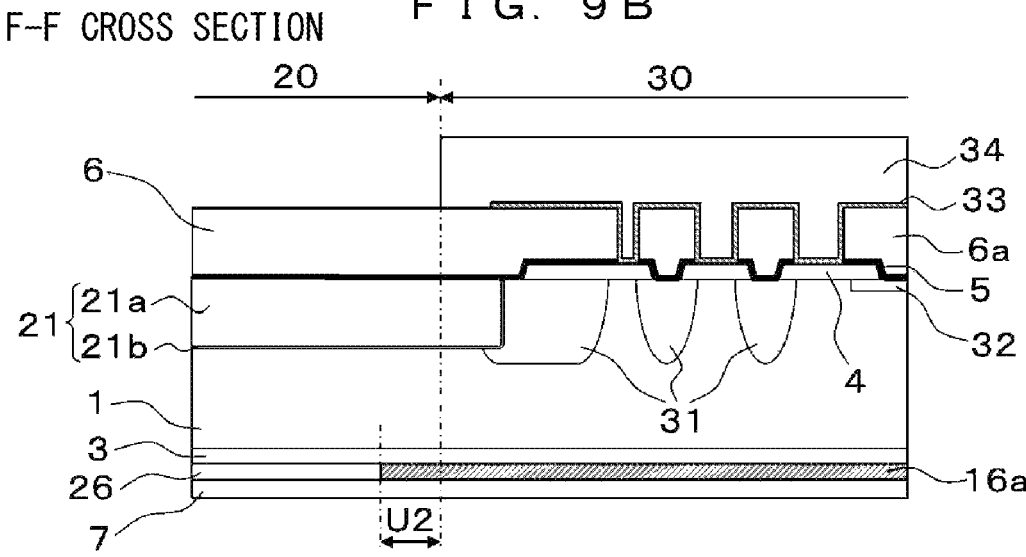

F I G. 1 0 A
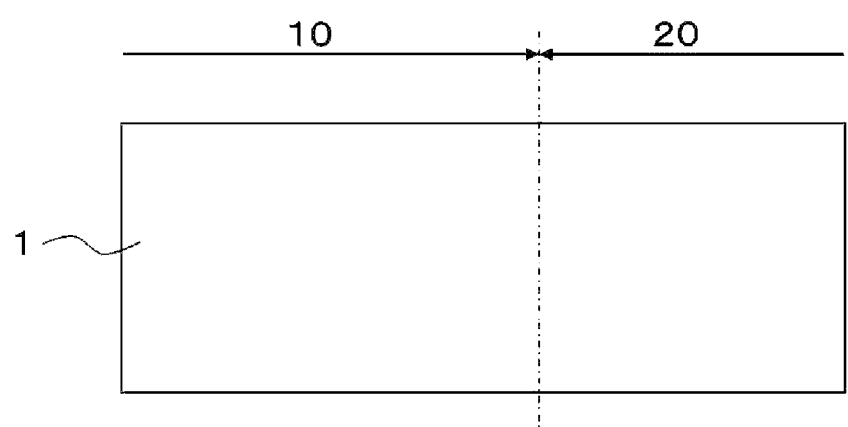
F I G. 1 0 B
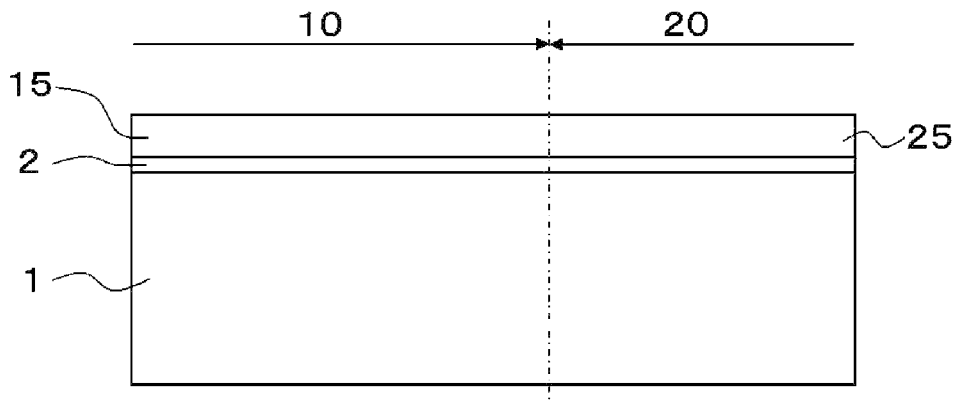

F I G.  1 1 A
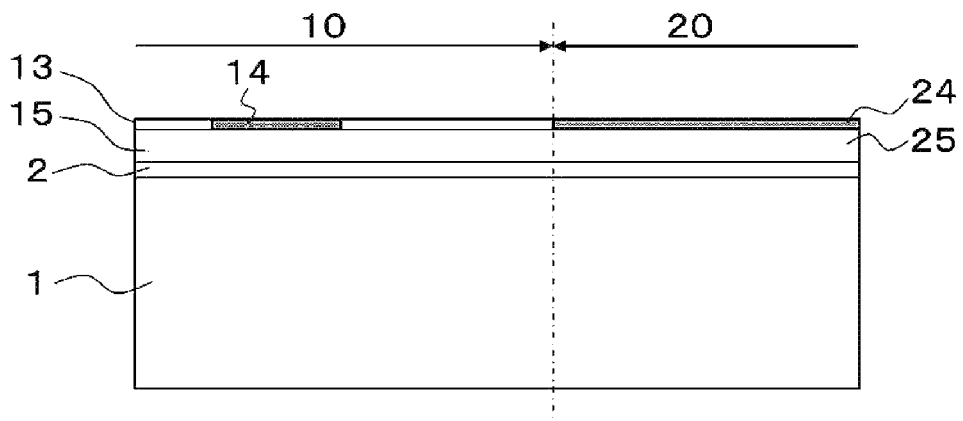
F I G.  1 1 B
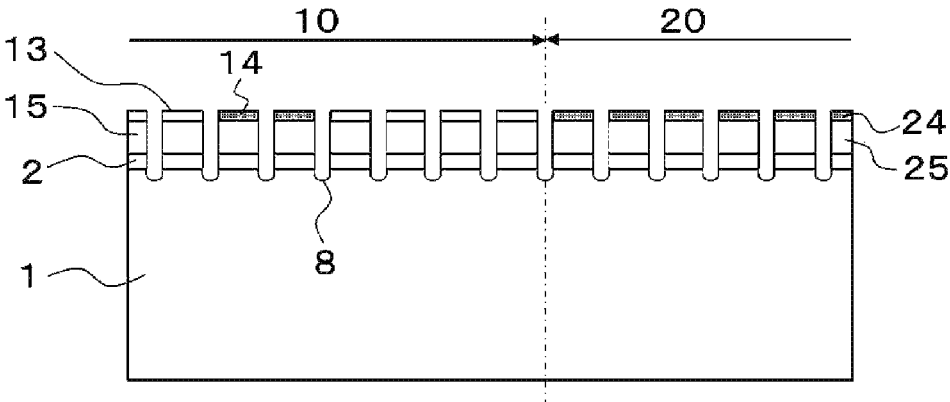

F I G .   1 3 A
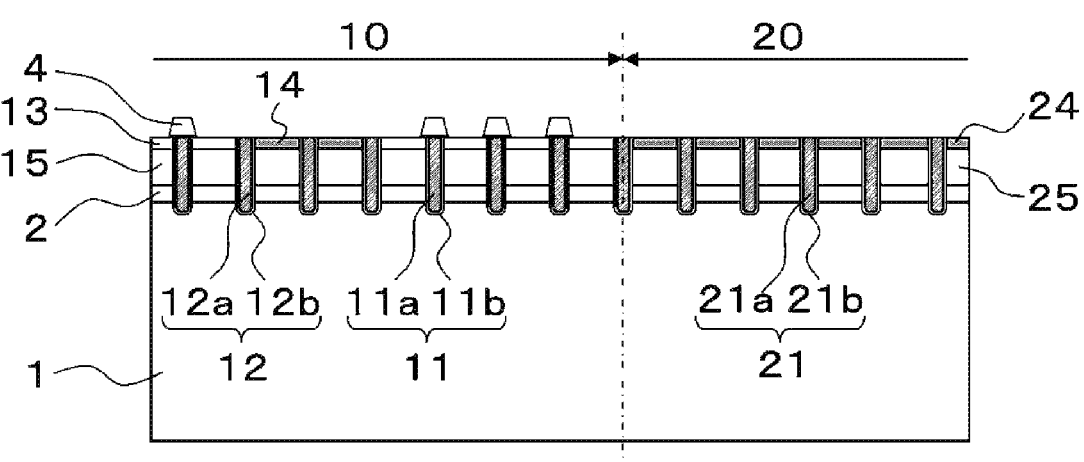
F I G .   1 3 B
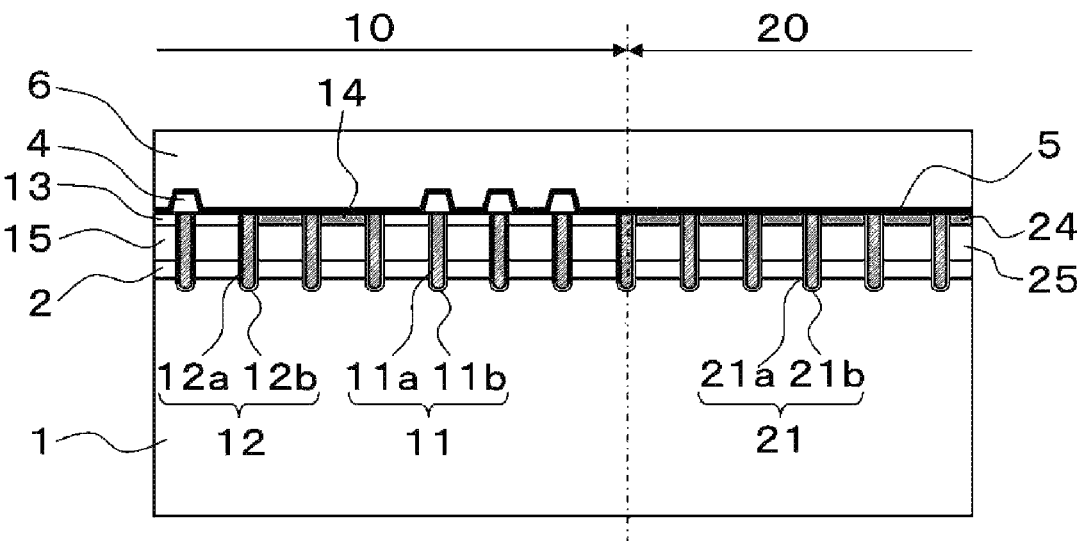

F I G.  1 5 A
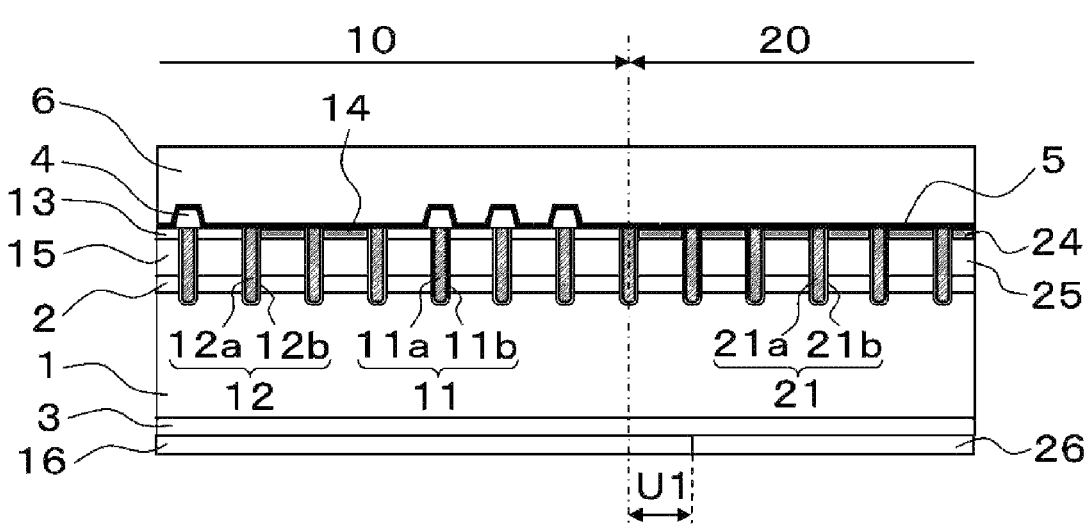
F I G.  1 5 B
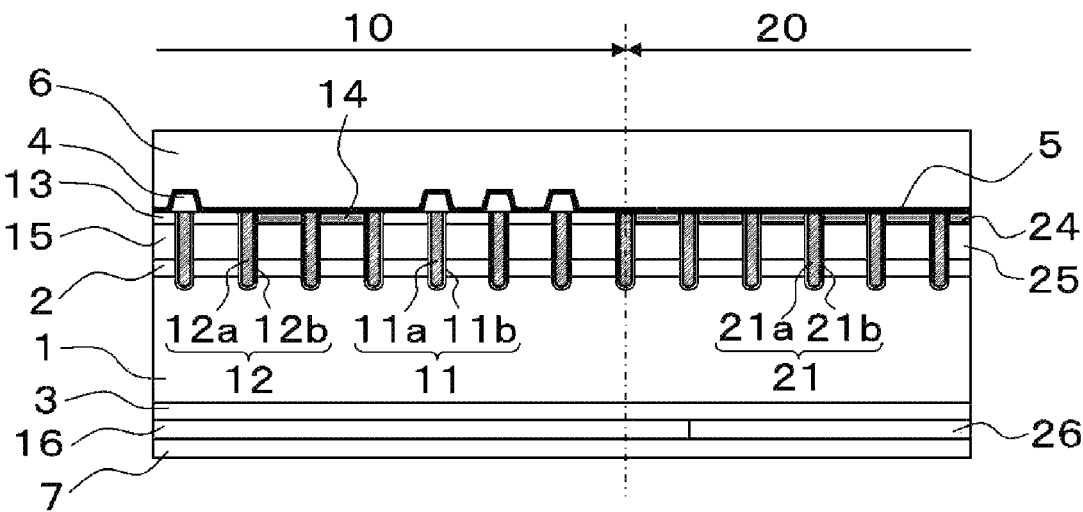

F I G.  1 6
H-H CROSS SECTION
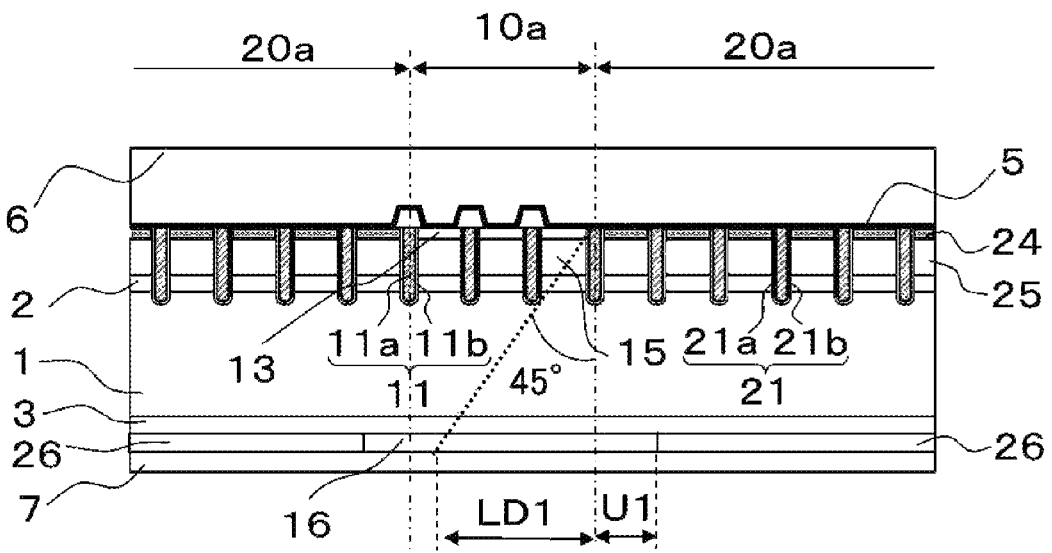

F I G .  1 7
COMPARATIVE EXAMPLE
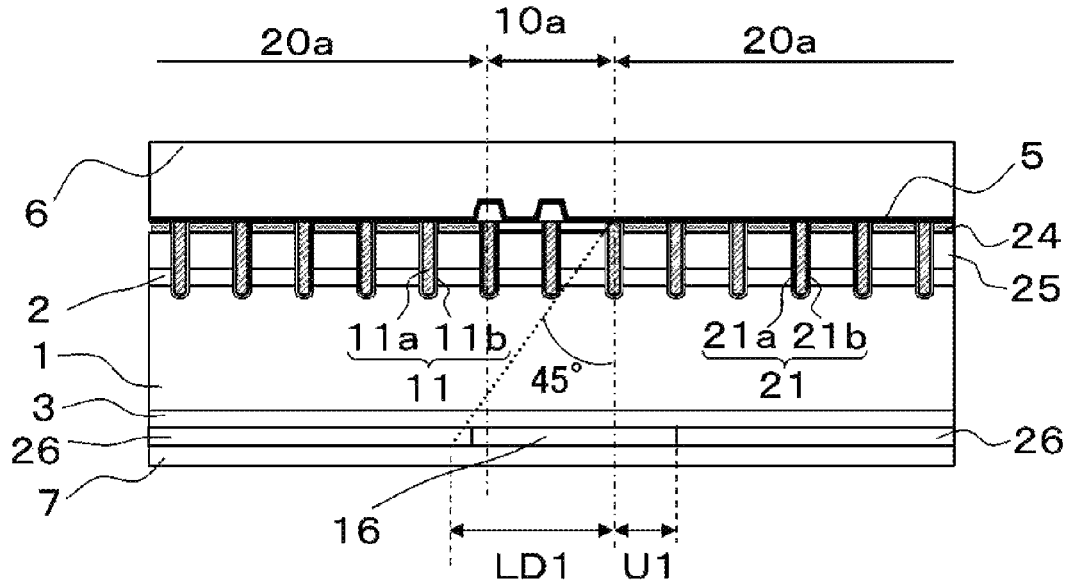

F I G.  1 8
J-J CROSS SECTION
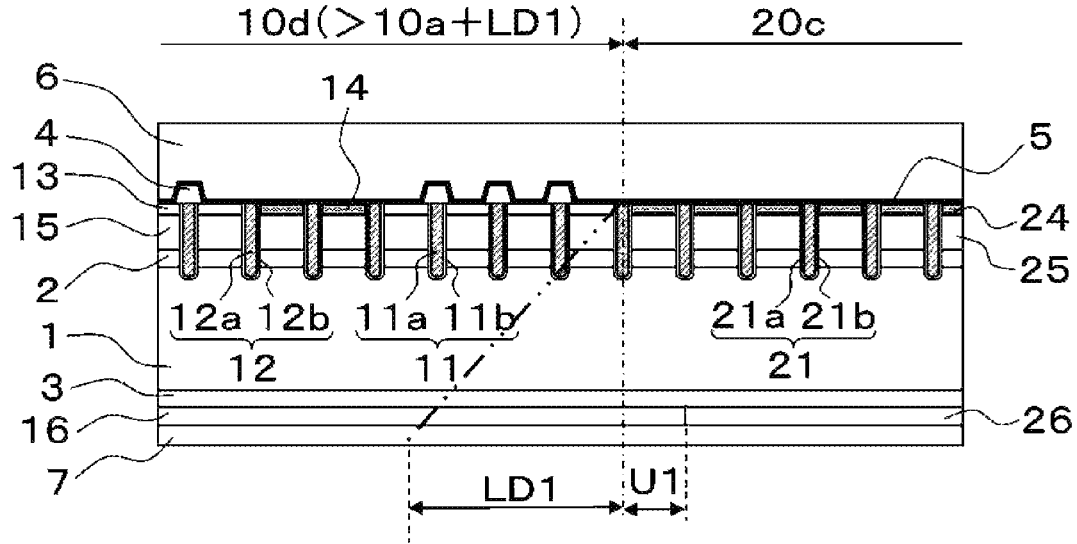

F I G.   2 0
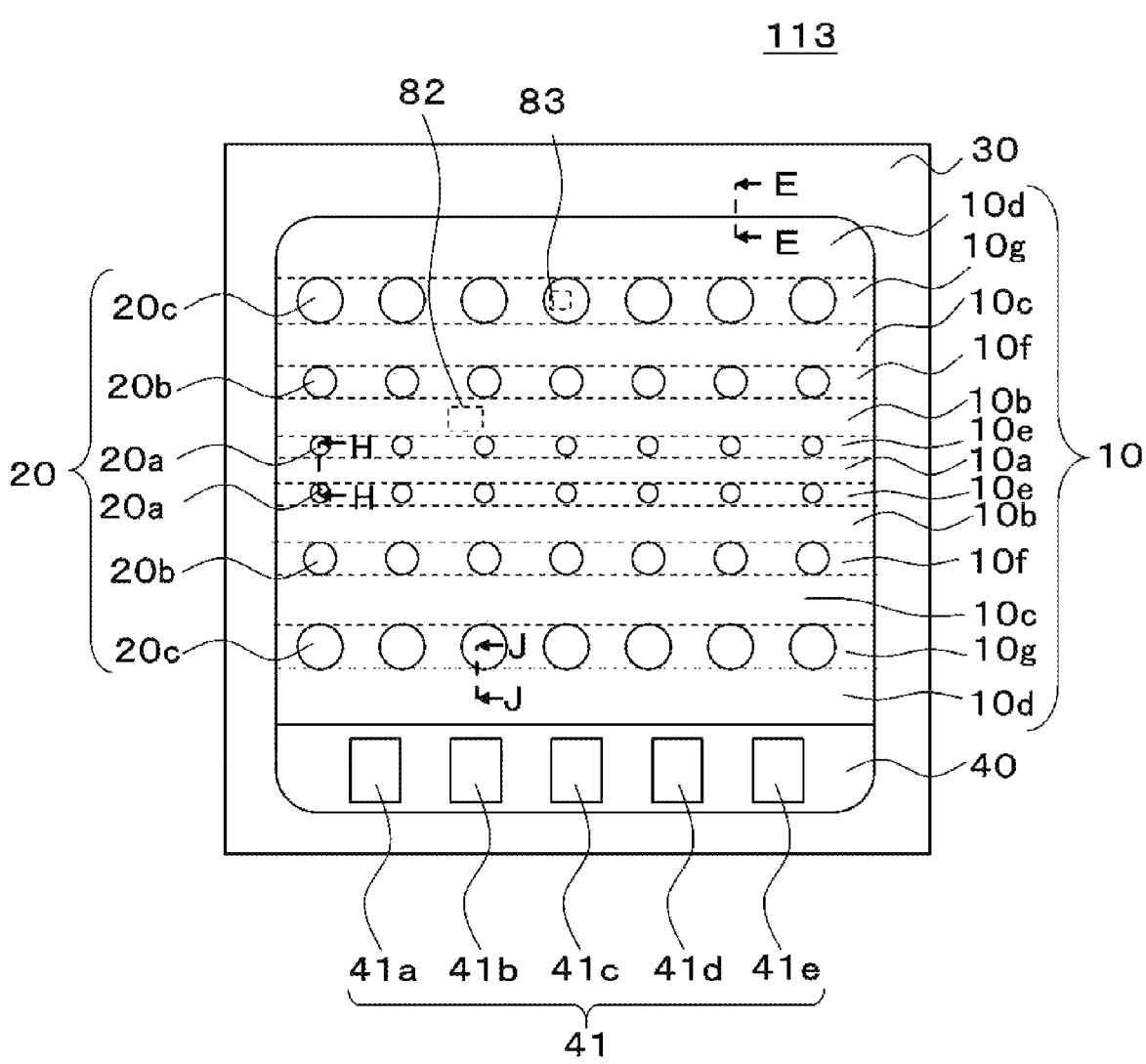

F I G .  2 2
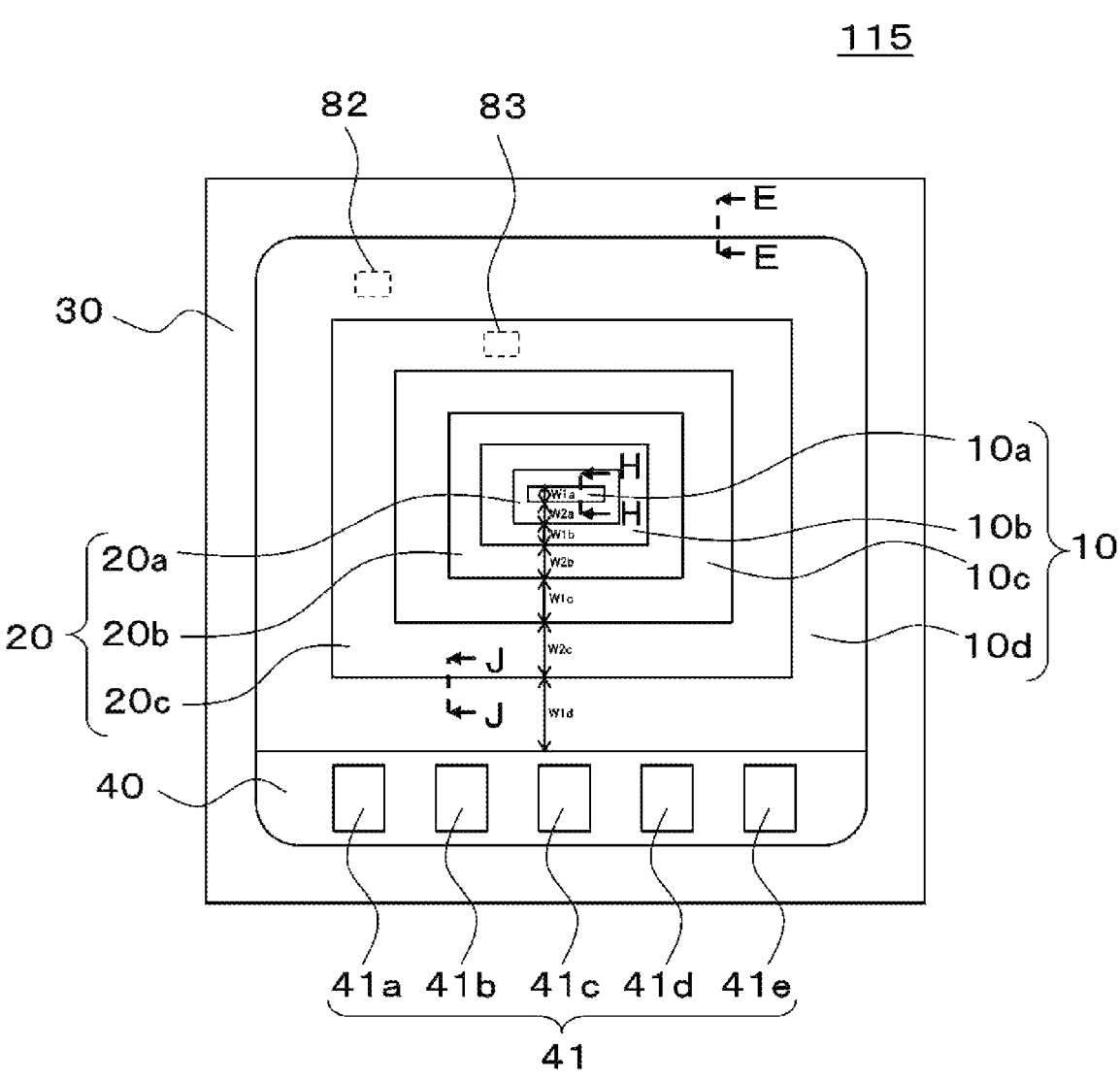

F I G .  2 3
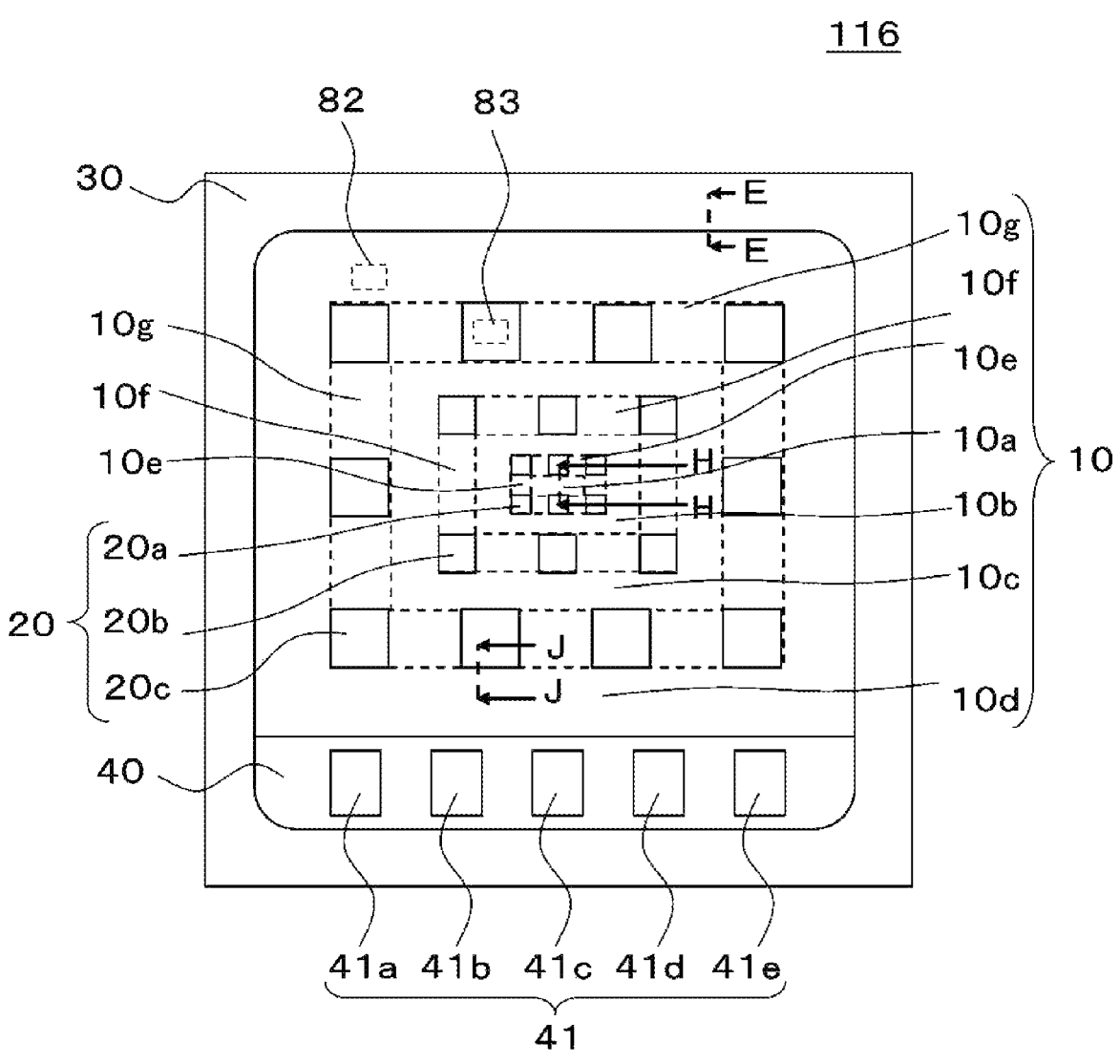

F I G .  2 4
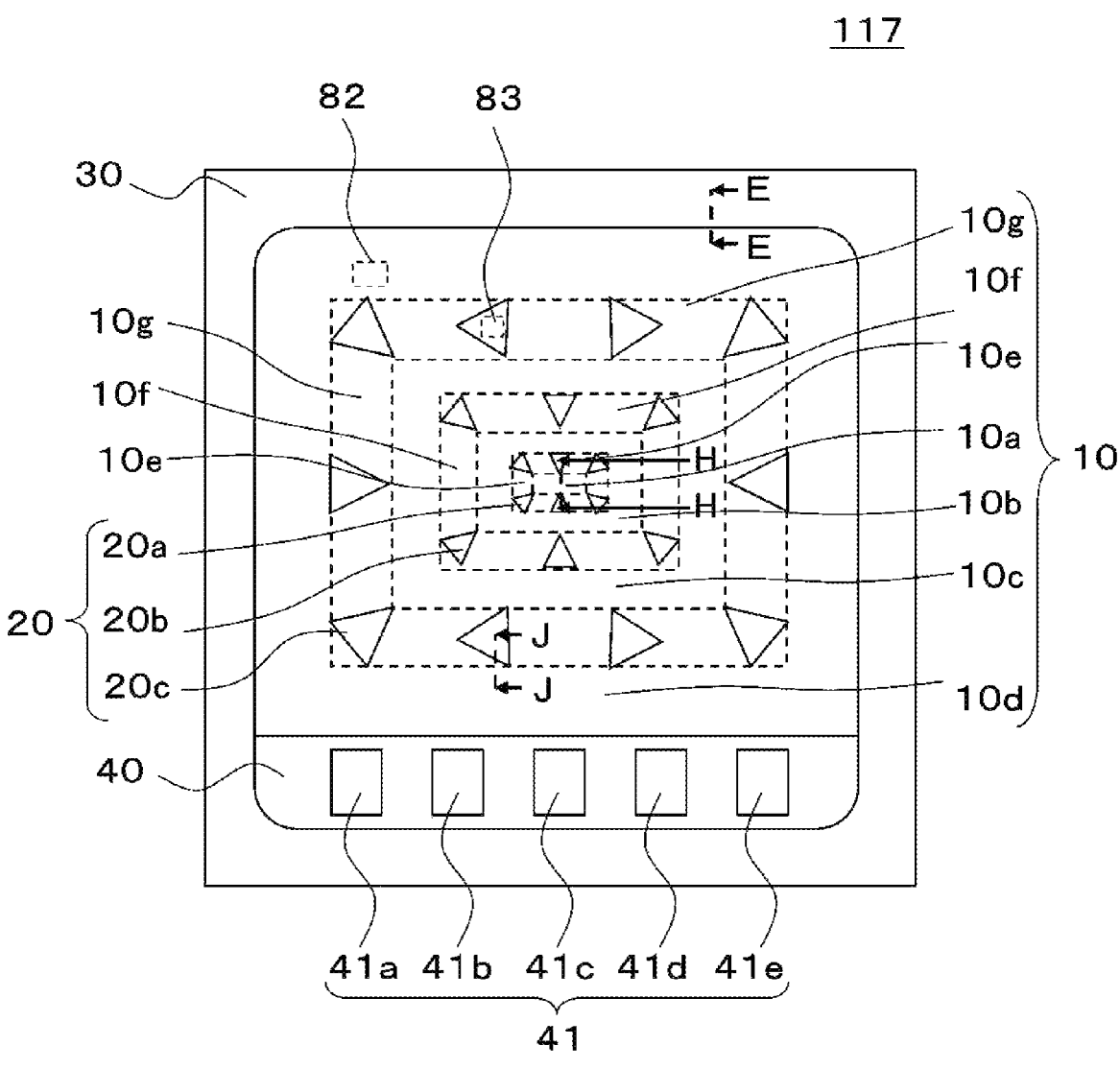

F I G.  2 5
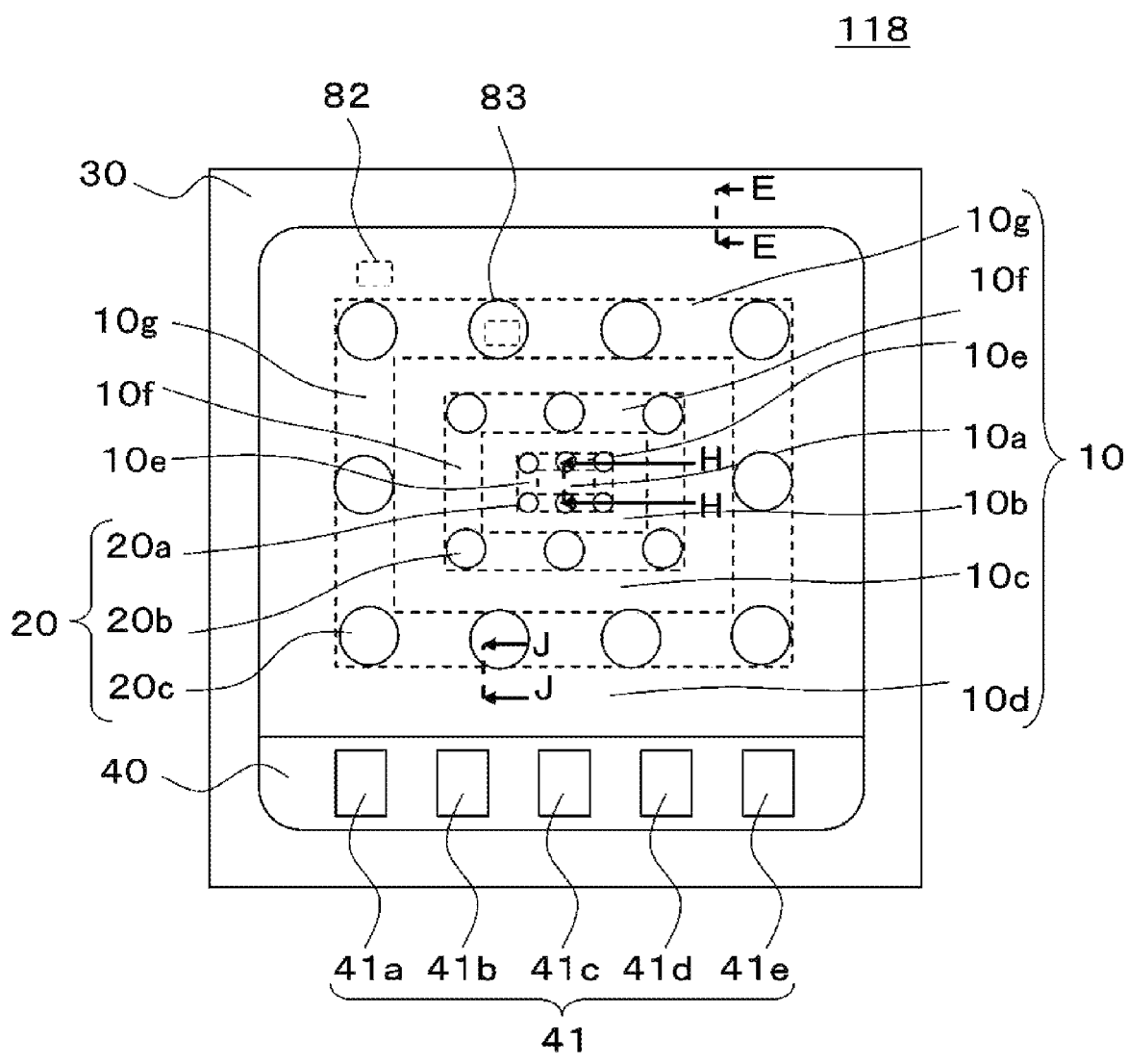

F I G. 2 6
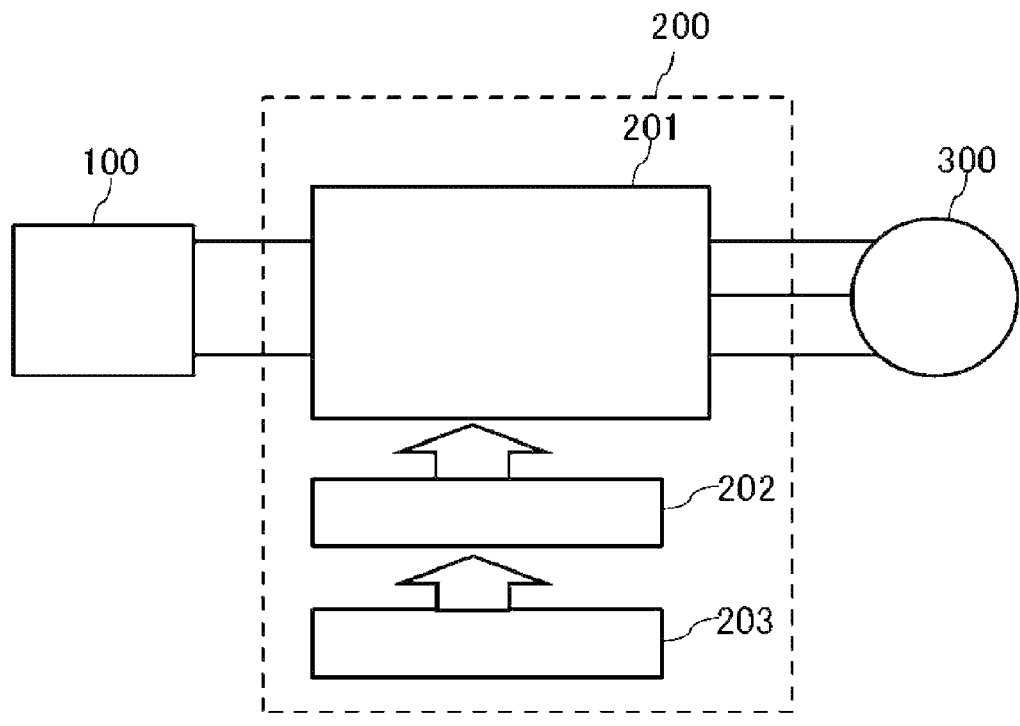

SEMICONDUCTOR DEVICE AND POWER CONVERSION APPARATUS

BACKGROUND OF THE INVENTION

Field of the Invention

The present disclosure relates to a semiconductor device and a power conversion apparatus.

DESCRIPTION OF THE BACKGROUND ART

In recent years, from the viewpoint of energy conservation, semiconductor devices with low energy loss are required in the fields of electric railway, in-vehicle, industrial machinery, or consumer equipment. For example, in a single semiconductor substrate on which an insulated gate bipolar transistor (IGBT) and a diode are provided, a configuration has been proposed in which each region of the IGBT and the diode is large at the center of the semiconductor device and is small on the end side of the semiconductor device.

However, the semiconductor device of Japanese Patent Application Laid-Open No. 2021-28930 has a problem of poor heat dissipation due to the large IGBT and diode regions at the center of the semiconductor device.

SUMMARY

The present disclosure has been made to solve the above problem, and an object of the present disclosure is to provide a semiconductor device with improved heat dissipation of the semiconductor device.

A semiconductor device according to the present disclosure is a semiconductor device having a cell region in which IGBT regions each functioning as an IGBT and diode regions each functioning as a diode are provided in a semiconductor substrate that has a drift layer of a first conductivity type between a first main surface and a second main surface opposite to the first main surface, the semiconductor device including: an IGBT region including a trench gate provided facing the drift layer via an insulating film in a trench provided penetrating an emitter layer of the first conductivity type and a base layer of a second conductivity type from the first main surface of the semiconductor substrate, and a collector layer of the second conductivity type provided closer to the second main surface than the drift layer; and a diode region including an anode layer of the second conductivity type provided closer to the first main surface than the drift layer and a cathode layer of the first conductivity type provided closer to the second main surface than the drift layer. There is an alternating region in which the IGBT regions and the diode regions are alternately arranged linearly in a plan view. In a first direction along the alternating region, a width of each of the IGBT regions and a width of each of the diode regions are not constant and are set so as to be two or more types of widths. In the alternating region, a width, in the first direction, of the IGBT region closest to a center of the cell region is equal to or smaller than widths of other IGBT regions in the first direction, and a width, in the first direction, of the diode region closest to the center of the cell region is equal to or smaller than widths of other diode regions in the first direction.

The heat dissipation of the semiconductor device can be improved.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a plan view illustrating a semiconductor device according to a first preferred embodiment;

FIG. 2 is a plan view illustrating a semiconductor device according to a second preferred embodiment;

FIG. 3 is a partially enlarged plan view illustrating a configuration of an IGBT region of the semiconductor device according to the first preferred embodiment;

FIG. 4 is a cross-sectional view taken along line A-A illustrating the configuration of the IGBT region of the semiconductor device according to the first preferred embodiment;

FIG. 5 is a cross-sectional view taken along line B-B illustrating the configuration of the IGBT region of the semiconductor device according to the first preferred embodiment;

FIG. 6 is a partially enlarged plan view illustrating a configuration of a diode region of the semiconductor device according to the first preferred embodiment;

FIG. 7 is a cross-sectional view taken along line C-C illustrating the configuration of the diode region of the semiconductor device according to the first preferred embodiment;

FIG. 8 is a cross-sectional view taken along line D-D illustrating the configuration of the diode region of the semiconductor device according to the first preferred embodiment;

FIGS. 9A and 9B are cross-sectional views taken along line E-E and a cross-sectional view taken along line F-F illustrating the configuration of the termination region of the semiconductor device according to the first preferred embodiment;

FIGS. 10A and 10B to FIGS. 15A and 15B are views each illustrating a method for manufacturing the semiconductor device according to the first preferred embodiment;

FIG. 16 is a cross-sectional view taken along line H-H illustrating a configuration of a cell region of the semiconductor device according to the first preferred embodiment;

FIG. 17 is a view illustrating a semiconductor device of a comparative example;

FIG. 18 is a cross-sectional view taken along line J-J illustrating the configuration of the cell region of the semiconductor device according to the first preferred embodiment;

FIGS. 19 and 20 are plan views each illustrating a modification of the semiconductor device according to the second preferred embodiment;

FIGS. 22 to 25 are plan views each illustrating a modification of a semiconductor device according to a fourth preferred embodiment; and FIG. 26 is a block diagram illustrating a configuration of a power conversion system of a fifth preferred embodiment.

DESCRIPTION OF THE PREFERRED EMBODIMENTS

Figure 12A:
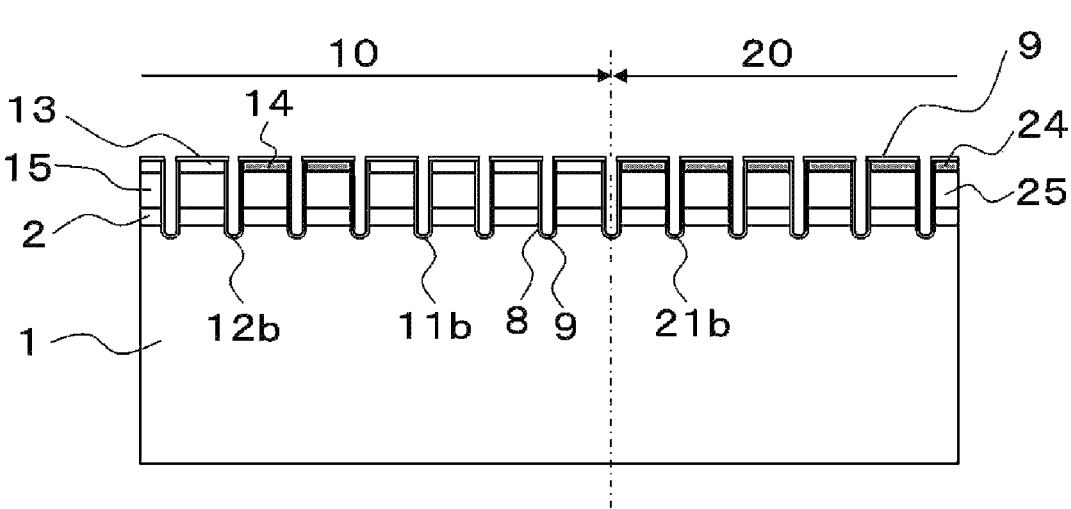

Hereinafter, preferred embodiments will be described with reference to the attached drawings. With the drawings being schematically illustrated, the interrelationship in size and position may vary. In the following description, the same or corresponding components are denoted by the same reference numerals, and repeated description may be omitted.

In the following description, terms such as "upper", "lower", and "side" may be used to refer to specific positions and directions, but these terms are used for convenience in order to facilitate understanding of the contents of the preferred embodiments and do not limit the positions and directions when implemented.

In the following description, n and p represent the conductivity types of the semiconductor, and in the present disclosure, the first conductivity type is described as the n-type and the second conductivity type is described as the p-type. In addition, $n^-$ indicates that the impurity concentration is lower than n, and $n^+$ indicates that the impurity concentration is higher than n. Similarly, $p^-$ indicates that the impurity concentration is lower than p, and $p^+$ indicates that the impurity concentration is higher than p.

First Preferred Embodiment

FIG. 1 is a plan view illustrating a semiconductor device according to a first preferred embodiment, and illustrates a semiconductor device being a reverse conducting IGBT (RC-IGBT). Note that the RC-IGBT is a semiconductor device in which an IGBT region functioning as an IGBT and a diode region functioning as a diode are provided on a single semiconductor substrate. FIG. 2 is a plan view illustrating a semiconductor device with another configuration according to the first preferred embodiment, and illustrates a semiconductor device being an RC-IGBT with another configuration. A semiconductor device 110 illustrated in FIG. 1 is provided with IGBT regions 10 and diode regions 20 arranged in a stripe shape, and may be simply referred to as a "stripe type". As will be described later in the second preferred embodiment and subsequent preferred embodiments, for example, the present disclosure may be applied to an "island type" in which the IGBT regions 10 are provided around the diode regions 20.

In FIG. 1, the semiconductor device 110 includes the IGBT regions 10 (10a, 10b, 10c, 10d) and the diode regions 20 (20a, 20b, 20c) in one semiconductor device. In the present disclosure, the IGBT regions 10 and the diode regions 20 are collectively referred to as a cell region. The IGBT regions 10 and the diode regions 20 are provided to extend from one end side to the other end side of the semiconductor device 110 and are alternately provided in a stripe shape in a direction orthogonal to the extending direction of the IGBT regions 10 and the diode regions 20. In FIG. 1, seven IGBT regions 10 (10a, 10b, 10c, 10d) and six diode regions 20 (20a, 20b, 20c) are illustrated, and all the diode regions 20 are sandwiched by the IGBT regions 10. However, the number of IGBT regions 10 and the number of diode regions 20 are not limited thereto, and the number of IGBT regions 10 may be seven or more and seven or less, and the number of diode regions 20 may be six or more and six or less. The IGBT region 10 and the diode region 20 in FIG. 1 may be interchanged in location, or all the IGBT regions 10 may be sandwiched between the diode regions 20.

In the present disclosure, a region in which the IGBT regions 10 and the diode regions 20 are alternately arranged linearly is referred to as an alternating region. A first direction is a direction along the alternating region, and the IGBT regions 10 and the diode regions 20 are alternately provided linearly in the first direction. As illustrated in FIG. 1, in the IGBT regions 10a, 10b, 10c, 10d, widths in the first direction are W1a, W1b, W1c, and W1d, respectively, and the widths in the first direction are different as W1d>W1c>W1b>W1a. That is, the width of the IGBT region 10a closest to the center of the cell region in the first direction is equal to or smaller than the widths of the other IGBT regions, and the IGBT regions 10a, 10b, 10c, 10d are provided from the center of the cell region toward the end of the cell region in ascending order of size. That is, in FIG. 1, the IGBT regions are provided in the order of 10a, 10b, 10c, 10d from the center of the cell region toward the end of the cell region in the first direction, which is the direction along the alternating region, in ascending order of width or area.

The widths of the diode regions 20a, 20b, and 20c in the first direction are W2a, W2b, and W2c, respectively, and the widths in the first direction are different as W2c>W2b>W2a. That is, the width of the diode region 20a closest to the cell center in the first direction is equal to or smaller than the widths of the other diode regions, and the diode regions 20a, 20b, 20c are provided from the center of the cell region toward the end of the cell region in ascending order of size. That is, in FIG. 1, the diode regions are provided in the order of 20a, 20b, and 20c from the center of the cell region toward the end of the cell region in the first direction, which is the direction along the alternating region, in ascending order of width or area. Although the number of IGBT regions and the number of diode regions 20 are each described with three or more types, the number only need be two or more types and is not limited to the number illustrated in the drawings.

FIG. 1 shows the vertical direction of the paper on the assumption that the IGBT region and the diode region become larger from the center to the end of the cell region in the first direction. However, it is sufficient that the first direction is a direction along the alternating region, and the IGBT region and the diode region may be provided similarly to the above description, with the horizontal direction of the paper, which is a direction perpendicular to the vertical direction of the paper, as the first direction.

As illustrated in FIG. 1, a pad region 40 is provided adjacent to the IGBT region 10d. The pad region 40 is a region where a control pad 41 for controlling the semiconductor device 110 is provided. Around the combined region of the cell region and the pad region 40, a termination region 30 is provided in order to hold the withstand voltage of the semiconductor device 110. A known withstand voltage holding structure can be appropriately selected and provided in the termination region 30. For the withstand voltage holding structure, for example, a field limiting ring (FLR) surrounding a cell region with a p-type termination well layer of a p-type semiconductor or a variation of lateral doping (VLD) surrounding a cell region with a p-type well layer with a concentration gradient may be provided on the first main surface side that is the front surface side of the semiconductor device 110, and the number of ring-shaped p-type termination well layers used for the FLR and the concentration distribution used for the VLD may be appropriately selected according to the withstand voltage design of the semiconductor device 110. The p-type termination well layer may be provided over substantially the entire pad region 40, and an IGBT cell or a diode cell may be provided in the pad region 40.

The control pad 41 may be, for example, a current sense pad 41a, a Kelvin emitter pad 41b, a gate pad 41c, and temperature sense diode pads 41d, 41e. The current sense pad 41a is a control pad for detecting a current flowing through the cell region of the semiconductor device 110 and is a control pad electrically connected to IGBT cells or diode cells in a part of the cell region such that, when a current flows through the cell region of the semiconductor device 110, the current flows at a fraction to tens of thousands of times the current flowing through the entire cell region.

The Kelvin emitter pad 41*b* and the gate pad 41*c* are control pads to which a gate drive voltage for controlling on/off of the semiconductor device 110 is applied. The Kelvin emitter pad 41*b* is electrically connected to the p-type base layer of the IGBT cell, and the gate pad 41*c* is electrically connected to the gate trench electrode of the IGBT cell. The Kelvin emitter pad 41*b* and the p-type base layer may be electrically connected via a p$^+$ type contact layer. The temperature sense diode pads 41*d*, 41*e* are control pads electrically connected to an anode and a cathode of a temperature sense diode provided in the semiconductor device 110. A voltage between the anode and the cathode of the temperature sense diode (not illustrated) provided in the cell region is measured to measure the temperature of the semiconductor device 110.

FIG. 3 is a partially enlarged plan view illustrating the configuration of the IGBT region of the semiconductor device according to the first preferred embodiment, and illustrates the configuration of the IGBT region 10 of the semiconductor device being the RC-IGBT. FIGS. 4 and 5 are cross-sectional views illustrating the configuration of the IGBT region of the semiconductor device according to the first preferred embodiment, and illustrate the configuration of the IGBT region 10 of the semiconductor device being the RC-IGBT. FIG. 3 is an enlarged view of a region surrounded by a broken line 82 in the semiconductor device 110 illustrated in FIG. 1 or a semiconductor device 111 illustrated in FIG. 2. FIG. 4 is a cross-sectional view taken along broken line A-A of the semiconductor device 110 illustrated in FIG. 3, and FIG. 5 is a cross-sectional view taken along broken line B-B of the semiconductor device 110 illustrated in FIG. 3.

As illustrated in FIG. 3, in the IGBT region 10, an active trench gate 11 and a dummy trench gate 12 are provided in a stripe shape. In the semiconductor device 110, the active trench gate 11 and the dummy trench gate 12 extend in the longitudinal direction of the IGBT region 10, and the longitudinal direction of the IGBT region 10 is the longitudinal direction of each of the active trench gate 11 and the dummy trench gate 12. On the other hand, in the semiconductor device 111, the horizontal direction of the paper may be the longitudinal direction of each of the active trench gate 11 and the dummy trench gate 12, and the vertical direction of the paper may be the longitudinal direction of each of the active trench gate 11 and the dummy trench gate 12.

The active trench gate 11 includes a gate trench electrode 11*a* in a trench formed in the semiconductor substrate via a gate trench insulating film 11*b*. The dummy trench gate 12 includes a dummy trench electrode 12*a* in a trench formed in the semiconductor substrate via a dummy trench insulating film 12*b*. The gate trench electrode 11*a* of the active trench gate 11 is electrically connected to the gate pad 41*c*. The dummy trench electrode 12*a* of the dummy trench gate 12 is electrically connected to an emitter electrode provided on the first main surface of the semiconductor device 110 or the semiconductor device 101. That is, the active trench gate 11 can apply a gate drive voltage, but the dummy trench gate 12 cannot apply a gate drive voltage.

On each side of the active trench gate 11 in the width direction, an n$^+$ type source layer 13 is provided in contact with the gate trench insulating film 11*b*. The n$^+$ type source layer 13 is a semiconductor layer containing, for example, arsenic or phosphorus as n-type impurities, and the n-type impurity concentration is 1.0E+17/cm$^3$ to 1.0E+20/cm$^3$. The n$^+$ type source layer 13 is provided alternately with p$^+$ type contact layer 14 along the extending direction of the active trench gate 11. The p$^+$ type contact layer 14 is also provided between two adjacent dummy trench gates 12. The p$^+$ type contact layer 14 is a semiconductor layer containing, for example, boron or aluminum as p-type impurities, and the p-type impurity concentration is 1.0E+15/cm$^3$ to 1.0E+20/cm$^3$.

As illustrated in FIG. 3, in the IGBT region 10 of the semiconductor device 110, three dummy trench gates 12 are arranged next to three active trench gates 11, and three active trench gates 11 are arranged next to three dummy trench gates 12. The IGBT region 10 has a configuration in which a set of active trench gates 11 and a set of dummy trench gates 12 are alternately arranged as described above. In FIG. 3, the number of active trench gates 11 included in one set of active trench gates 11 is three, but only need be one or more. The number of dummy trench gates 12 included in a set of one dummy trench gate 12 may be one or more, and the number of dummy trench gates 12 may be zero. That is, all the trenches provided in the IGBT region 10 may be used as the active trench gate 11.

FIG. 4 is a cross-sectional view of the semiconductor device 110 taken along broken line A-A in FIG. 3, and illustrates a cross-sectional view of the IGBT region 10. The semiconductor device 110 includes an n$^-$ type drift layer 1 made of a semiconductor substrate. The n$^-$ type drift layer 1 is an n$^-$ type semiconductor layer containing, for example, arsenic or phosphorus as n-type impurities, and the n-type impurity concentration is 1.0E+12/cm$^3$ to 1.0E+15/cm$^3$. In FIG. 4, the semiconductor substrate is in a range from the n$^+$ type source layer 13 and the p$^+$ type contact layer 14 to a p-type collector layer 16. In FIG. 4, the upper end of each of the n$^+$ type source layer 13 and the p$^+$ type contact layer 14 on the paper is referred to as the first main surface of the semiconductor substrate, and the lower end of the p-type collector layer 16 on the paper is referred to as the second main surface of the semiconductor substrate. The first main surface of the semiconductor substrate is the main surface on the front surface side of the semiconductor device 110, and the second main surface of the semiconductor substrate is the main surface on the back surface side of the semiconductor device 110. The semiconductor device 110 includes the n$^-$ type drift layer 1 between the first main surface and the second main surface opposite to the first main surface in the IGBT region 10 being the cell region.

As illustrated in FIG. 4, in the IGBT region 10, an n-type carrier accumulation layer 2 with a higher n$^-$ type impurity concentration than the n$^-$ type drift layer 1 is provided on the first main surface side of the n$^-$ type drift layer 1. The n-type carrier accumulation layer 2 is a semiconductor layer containing, for example, arsenic or phosphorus as n-type impurities, and the n-type concentration is 1.0E+13/cm$^3$ to 1.0E+17/cm$^3$. In the semiconductor device 110, the n-type carrier accumulation layer 2 may not be provided, and the n$^-$ type drift layer 1 may also be provided in the region of the n-type carrier accumulation layer 2 illustrated in FIG. 4. Providing the n-type carrier accumulation layer 2 can lead to a reduction in energization loss when a current flows through the IGBT region 10. The n-type carrier accumulation layer 2 and the n$^-$ type drift layer 1 may be collectively referred to as a drift layer.

The n-type carrier accumulation layer 2 is formed by ion-implanting n-type impurities into the semiconductor substrate constituting the n$^-$ type drift layer 1 and then diffusing the n-type impurities implanted by annealing into the semiconductor substrate as the n⁻ type drift layer 1.

On the first main surface side of the n-type carrier accumulation layer 2, a p-type base layer 15 is provided. The p-type base layer 15 is a semiconductor layer containing, for example, boron or aluminum as p-type impurities, and the p-type impurity concentration is $1.0E+12/cm^3$ to $1.0E+19/cm^3$. The p-type base layer 15 is in contact with the gate trench insulating film 11b of the active trench gate 11. On the first main surface side of the p-type base layer 15, the n⁺ type source layer 13 is provided in contact with the gate trench insulating film 11b of the active trench gate 11, and a p⁺ type contact layer 14 is provided in the remaining region. The n⁺ type source layer 13 and the p⁺ type contact layer 14 constitute the first main surface of the semiconductor substrate. Note that the p⁺ type contact layer 14 is a region with a higher p-type impurity concentration than the p-type base layer 15. The p⁺ type contact layer 14 and the p-type base layer 15 may be separately referred to when needing to be distinguished from each other, and the p⁺ type contact layer 14 and the p-type base layer 15 may be collectively referred to as a p-type base layer.

In the semiconductor device 110, an n-type buffer layer 3 with a higher n-type impurity concentration than the n⁻ type drift layer 1 is provided on the second main surface side of the n⁻ type drift layer 1. The n-type buffer layer 3 is provided to prevent the punch-through of a depletion layer extending from the p-type base layer 15 to the second main surface side when the semiconductor device 110 is in an off-state. The n-type buffer layer 3 may be formed by, for example, implanting phosphorus (P) or proton (H+) or may be formed by implanting both phosphorus (P) and proton (H+). The n-type impurity concentration of the n-type buffer layer 3 is $1.0E+12/cm^3$ to $1.0E+18/cm^3$. In the semiconductor device 110, the n-type buffer layer 3 may not be provided, and the n⁻ type drift layer 1 may also be provided in the region of the n-type buffer layer 3 illustrated in FIG. 4. The n-type buffer layer 3 and the n⁻ type drift layer 1 may be collectively referred to as a drift layer.

In the semiconductor device 110, the p-type collector layer 16 is provided on a second main surface side of the n-type buffer layer 3. That is, the p-type collector layer 16 is provided between the n⁻ type drift layer 1 and the second main surface. The p-type collector layer 16 is a semiconductor layer containing, for example, boron or aluminum as p-type impurities, and the p-type impurity concentration is $1.0E+16/cm^3$ to $1.0E+20/cm^3$. The p-type collector layer 16 constitutes the second main surface of the semiconductor substrate. The p-type collector layer 16 is provided not only in the IGBT region 10 but also in the termination region 30, and a portion of the p-type collector layer 16 provided in the termination region 30 constitutes a p-type termination collector layer. In addition, the p-type collector layer 16 may be provided partially protruding from the IGBT region 10 to the diode region 20.

As illustrated in FIG. 4, in the semiconductor device 110, a trench that penetrates the p-type base layer 15 from the first main surface of the semiconductor substrate and reaches the n⁻ type drift layer 1 is formed. The gate trench electrode 11a is provided in the trench via the gate trench insulating film 11b to constitute an active trench gate 11. The gate trench electrode 11a faces the n⁻ type drift layer 1 via the gate trench insulating film 11b. The dummy trench electrode 12a is provided in the trench via the dummy trench insulating film 12b to constitute a dummy trench gate 12. The dummy trench electrode 12a faces the n⁻ type drift layer 1 via the dummy trench insulating film 12b. The gate trench insulating film 11b of the active trench gate 11 is in contact with the p-type base layer 15 and the n⁺ type source layer 13. When a gate drive voltage is applied to the gate trench electrode 11a, a channel is formed in the p-type base layer 15 in contact with the gate trench insulating film 11b of the active trench gate 11.

As illustrated in FIG. 4, on the gate trench electrode 11a of the active trench gate 11, an interlayer insulating film 4 is provided. On a region of the first main surface of the semiconductor substrate, where the interlayer insulating film 4 is not provided, and on the interlayer insulating film 4, a barrier metal 5 is formed. The barrier metal 5 may be, for example, a conductor containing titanium (Ti), and may be, for example, titanium nitride or TiSi obtained by alloying titanium and silicon (Si).

As illustrated in FIG. 4, the barrier metal 5 is in ohmic contact with the n⁺ type source layer 13, the p⁺ type contact layer 14, and the dummy trench electrode 12a and is electrically connected to the n⁺ type source layer 13, the p⁺ type contact layer 14, and the dummy trench electrode 12a. On the barrier metal 5, an emitter electrode 6 is provided. The emitter electrode 6 may be formed of, for example, an aluminum alloy such as an aluminum silicon alloy (Al—Si-based alloy), or may be an electrode including a plurality of layers of metal films in which a plating film is formed on an electrode formed of an aluminum alloy by electroless plating or electrolytic plating. The plating film formed by electroless plating or electrolytic plating may be, for example, a nickel (Ni) plating film.

Although FIG. 4 illustrates the configuration in which interlayer insulating film 4 is not provided but a contact hole 19 is provided on the dummy trench electrode 12a of the dummy trench gate 12. However, the interlayer insulating film 4 may be formed on the dummy trench electrode 12a of the dummy trench gate 12. When the interlayer insulating film 4 is formed on the dummy trench electrode 12a of the dummy trench gate 12, the emitter electrode 6 and the dummy trench electrode 12a may be electrically connected in another cross section.

When the width of the contact hole 19 provided in the interlayer insulating film 4 is small, and favorable embedding cannot be obtained in the emitter electrode 6, tungsten having better embeddability than the emitter electrode 6 may be disposed in the contact hole 19, and the emitter electrode 6 may be provided on the tungsten. Note that the barrier metal 5 may not be provided, but the emitter electrode 6 may be provided on the n⁺ type source layer 13, the p⁺ type contact layer 14, and the dummy trench electrode 12a. The barrier metal 5 may be provided only on the n-type semiconductor layer such as the n⁺ type source layer 13. The barrier metal 5 and the emitter electrode 6 may be collectively referred to as an emitter electrode.

On the second main surface side of the p-type collector layer 16, the collector electrode 7 is provided. Similarly to the emitter electrode 6, a collector electrode 7 may be made of an aluminum alloy or an aluminum alloy and a plating film. The collector electrode 7 may have a configuration different from that of the emitter electrode 6. The collector electrode 7 is in ohmic contact with the p-type collector layer 16 and is electrically connected to the p-type collector layer 16.

FIG. 5 is a cross-sectional view of the semiconductor device 110 taken along broken line B-B in FIG. 3 and is a cross-sectional view of the IGBT region 10. The cross-sectional view taken along broken line B-B illustrated in FIG. 5 differs from the cross-sectional view taken along broken line A-A illustrated in FIG. 4 in that the n⁺ type source layer 13, which is provided on the first main surface side of the semiconductor substrate in contact with the active trench gate 11, is not seen. That is, as illustrated in FIG. 3, the $n^+$ type source layer 13 is selectively provided on the first main surface side of the p-type base layer. Note that the p-type base layer referred to herein is a p-type base layer, as which the p-type base layer 15 and the $p^+$ type contact layer 14 are collectively referred to.

FIG. 6 is a partially enlarged plan view illustrating the configuration of the diode region of the semiconductor device according to the first preferred embodiment, and illustrates the configuration of the diode region of the semiconductor device being the RC-IGBT. FIGS. 7 and 8 are cross-sectional views illustrating the configuration of the diode region of the semiconductor device according to the first preferred embodiment, and illustrate the configuration of the diode region of the semiconductor device being the RC-IGBT. FIG. 6 is an enlarged view of a region surrounded by a broken line 83 in the semiconductor device 110 illustrated in FIG. 1. FIG. 7 is a cross-sectional view taken along broken line C-C of the semiconductor device 110 illustrated in FIG. 6. FIG. 8 is a cross-sectional view taken along broken line D-D of the semiconductor device 110 illustrated in FIG. 6.

A diode trench gate 21 extends along the first main surface of the semiconductor device 110 or the semiconductor device 101 from one end side of the diode region 20 being the cell region toward the opposite end side. The diode trench gate 21 includes a diode trench electrode 21a in a trench formed in the semiconductor substrate of the diode region 20 via a diode trench insulating film 21b. The diode trench electrode 21a faces the $n^-$ type drift layer 1 via the diode trench insulating film 21b. A $p^+$ type contact layer 24 and a p-type anode layer 25 are provided between two adjacent diode trench gates 21. The $p^+$ type contact layer 24 is a semiconductor layer containing, for example, boron or aluminum as p-type impurities, and the p-type impurity concentration is $1.0E+15/cm^3$ to $1.0E+20/cm^3$. The p-type anode layer 25 is a semiconductor layer containing, for example, boron or aluminum as p-type impurities, and the p-type impurity concentration is $1.0E+12/cm^3$ to $1.0E+19/cm^3$. The $p^+$ type contact layer 24 and the p-type anode layer 25 are alternately provided in the longitudinal direction of the diode trench gate 21.

FIG. 7 is a cross-sectional view of the semiconductor device 110 taken along broken line C-C in FIG. 6 and is a cross-sectional view of the diode region 20. The semiconductor device 110 also includes an $n^-$ type drift layer 1 made of a semiconductor substrate in the diode region 20 as in the IGBT region 10. The $n^-$ type drift layer 1 of the diode region 20 and the $n^-$ type drift layer 1 of the IGBT region 10 are continuously and integrally formed and are formed of the same semiconductor substrate. In FIG. 7, the semiconductor substrate ranges from the $p^+$ type contact layer 24 to an $n^+$ type cathode layer 26. In FIG. 7, the upper end of the $p^+$ type contact layer 24 on the paper is referred to as the first main surface of the semiconductor substrate, and the lower end of the $n^+$ type cathode layer 26 on the paper is referred to as the second main surface of the semiconductor substrate. The first main surface of the diode region 20 is flush with the first main surface of the IGBT region 10, and the second main surface of the diode region 20 is flush with the second main surface of the IGBT region 10.

As illustrated in FIG. 7, also in the diode region 20, similarly to the IGBT region 10, the n-type carrier accumulation layer 2 is provided on the first main surface side of the $n^-$ type drift layer 1, and the n-type buffer layer 3 is provided on the second main surface side of the $n^-$ type drift layer 1. The n-type carrier accumulation layer 2 and the n-type buffer layer 3 provided in the diode region 20 have the same configuration as the n-type carrier accumulation layer 2 and the n-type buffer layer 3 provided in the IGBT region 10. Note that the n-type carrier accumulation layer 2 is not necessarily provided in the IGBT region 10 and the diode region 20, and even when the n-type carrier accumulation layer 2 is provided in the IGBT region 10, the n-type carrier accumulation layer 2 may not be provided in the diode region 20. Similarly to the IGBT region 10, the $n^-$ type drift layer 1, the n-type carrier accumulation layer 2, and the n-type buffer layer 3 may be collectively referred to as a drift layer.

The p-type anode layer 25 is provided on the first main surface side of the n-type carrier accumulation layer 2. The p-type anode layer 25 is provided between the $n^-$ type drift layer 1 and the first main surface. The p-type anode layer 25 may have the same p-type impurity concentration as the p-type base layer 15 in the IGBT region 10, and the p-type anode layer 25 and the p-type base layer 15 may be formed simultaneously. Further, the p-type anode layer 25 and the p-type base layer 15 may be formed at the same depth in the direction toward the second main surface. The p-type impurity concentration of the p-type anode layer 25 may be made lower than the p-type impurity concentration of the p-type base layer 15 in the IGBT region 10 to reduce the amount of holes flowing into the diode region 20 during diode operation. By reducing the amount of holes flowing during diode operation, the recovery current during diode operation can be reduced.

The $p^+$ type contact layer 24 is provided on the first main surface side of the p-type anode layer 25. The p-type impurity concentration of the $p^+$ type contact layer 24 may be the same as or different from the p-type impurity concentration of the $p^+$ type contact layer 14 in the IGBT region 10. The $p^+$ type contact layer 24 constitutes the first main surface of the semiconductor substrate. Note that the $p^+$ type contact layer 24 is a region with a higher p-type impurity concentration than the p-type anode layer 25. The $p^+$ type contact layer 24 and the p-type anode layer 25 may be separately referred to when needing to be distinguished from each other, and the $p^+$ type contact layer 24 and the p-type anode layer 25 may be collectively referred to as a p-type anode layer.

In the diode region 20, the $n^+$ type cathode layer 26 is provided on the second main surface side of the n-type buffer layer 3. The $n^+$ type cathode layer 26 is provided between the $n^-$ type drift layer 1 and the second main surface. The $n^+$ type cathode layer 26 is a semiconductor layer containing, for example, arsenic or phosphorus as n-type impurities, and the n-type concentration is $1.0E+16/cm^3$ to $1.0E+21/cm^3$. As illustrated in FIG. 2, the $n^+$ type cathode layer 26 is provided in a part or all of the diode region 20. The $n^+$ type cathode layer 26 constitutes the second main surface of the semiconductor substrate. Although not illustrated, p-type impurities may be further selectively implanted into the region where the $n^+$ type cathode layer 26 is formed as described above, and the p-type cathode layer may be provided using a part of the region where the $n^+$ type cathode layer 26 is formed as a p-type semiconductor.

As illustrated in FIG. 7, in the diode region 20 of the semiconductor device 110, a trench that penetrates the p-type anode layer 25 from the first main surface of the semiconductor substrate and reaches the $n^-$ type drift layer 1 is formed. The diode trench electrode 21a is provided in the trench of the diode region 20 via the diode trench insulating film 21b to constitute a diode trench gate 21. The diode trench electrode 21a faces the n-type drift layer 1 via the diode trench insulating film 21b.

As illustrated in FIG. 7, the barrier metal 5 is provided on the diode trench electrode 21a and the p⁺ type contact layer 24. The barrier metal 5 is in ohmic contact with the diode trench electrode 21a and the p⁺ type contact layer 24 and is electrically connected to the diode trench electrode and the p⁺ type contact layer 24. The barrier metal 5 may have the same configuration as the barrier metal 5 in the IGBT region 10. On the barrier metal 5, an emitter electrode 6 is provided. The emitter electrode 6 provided in the diode region 20 is formed continuously with the emitter electrode 6 provided in the IGBT region 10. As in the case of the IGBT region 10, the barrier metal 5 may not be provided, but the diode trench electrode 21a and the p⁺ type contact layer 24 may be brought into ohmic contact with the emitter electrode 6.

Although FIG. 7 illustrates the configuration in which interlayer insulating film 4 is not provided but a contact hole 19 is provided on the diode trench electrode 21a of the diode trench gate 21. However, the interlayer insulating film 4 may be formed on the diode trench electrode 21a of the diode trench gate 21. When the interlayer insulating film 4 is formed on the diode trench electrode 21a of the diode trench gate 21, the emitter electrode 6 and the diode trench electrode 21a may be electrically connected in another cross section.

On the second main surface side of the n⁺ type cathode layer 26, the collector electrode 7 is provided. Similarly to the emitter electrode 6, the collector electrode 7 in the diode region 20 is formed continuously with the collector electrode 7 provided in the IGBT region 10. The collector electrode 7 is in ohmic contact with the n⁺ type cathode layer 26 and is electrically connected to the n⁺ type cathode layer 26.

FIG. 8 is a cross-sectional view of the semiconductor device 110 taken along broken line D-D in FIG. 6 and is a cross-sectional view of the diode region 20. The cross-sectional view taken along broken line D-D illustrated in FIG. 8 differs from the cross-sectional view taken along broken line C-C illustrated in FIG. 7 in that the p⁺ type contact layer 24 is not provided between the p-type anode layer 25 and the barrier metal 5, and the p-type anode layer 25 constitutes the first main surface of the semiconductor substrate. That is, the p⁺ type contact layer 24 illustrated in FIG. 7 is selectively provided on the first main surface side of the p-type anode layer 25.

FIGS. 9A and 9B are cross-sectional views illustrating the configuration of the termination region of the semiconductor device being the RC-IGBT. FIG. 10A is a cross-sectional view taken along broken line E-E in FIG. 1 or 2 and is a cross-sectional view from the IGBT region 10 to the termination region 30. FIG. 10B is a cross-sectional view taken along broken line F-F in FIG. 1 and is a cross-sectional view from the diode region 20 to the termination region 30.

As illustrated in FIGS. 9A and 9B, the termination region 30 of the semiconductor device 110 includes the n⁻ type drift layer 1 between the first main surface and the second main surface of the semiconductor substrate. The first main surface and the second main surface of the termination region 30 are flush with the first main surface and the second main surface of each of the IGBT region 10 and the diode region 20. The n⁻ type drift layer 1 in the termination region 30 has the same configuration as and is continuously and integrally formed with the n⁻ type drift layer 1 in each of the IGBT region 10 and the diode region 20.

On the first main surface side of the n⁻ type drift layer 1, that is, between the first main surface of the semiconductor substrate and the n⁻ type drift layer 1, a p-type termination well layer 31 is provided. The p-type termination well layer 31 is a semiconductor layer containing, for example, boron or aluminum as p-type impurities, and the p-type impurity concentration is $1.0E+14/cm^3$ to $1.0E+19/cm^3$. The p-type termination well layer 31 is provided to surround the cell region including the IGBT region 10 and the diode region 20. The p-type termination well layers 31 are provided in a plurality of ring shapes, and the number of p-type termination well layers 31 to be provided is appropriately selected according to the withstand voltage design of the semiconductor device 110. On the further outer edge side of the p-type termination well layer 31, an n⁺ type channel stopper layer 32 is provided, and the n⁺ type channel stopper layer 32 surrounds the p-type termination well layer 31.

Between the n⁻ type drift layer 1 and the second main surface of the semiconductor substrate, a p-type termination collector layer 16a is provided. The p-type termination collector layer 16a is formed integrally and continuously with the p-type collector layer 16 provided in the cell region. Therefore, the p-type collector layer 16 may include the p-type termination collector layer 16a when referred to. In the configuration in which the diode region 20 is provided adjacent to the termination region 30 as in the semiconductor device 110 illustrated in FIG. 1, as illustrated in FIG. 9B, the p-type termination collector layer 16a is provided such that the end on the diode region 20 side protrudes to the diode region 20 by a distance U2. As described above, the p-type termination collector layer 16a is provided protruding to the diode region 20, whereby it is possible to increase the distance between the n⁺ type cathode layer 26 in the diode region 20 and the p-type termination well layer 31 and to prevent the p-type termination well layer 31 from operating as the anode of the diode. The distance U2 may be, for example, 100 μm.

The collector electrode 7 is provided on the second main surface of the semiconductor substrate. The collector electrode 7 is integrally formed continuously from the cell region including the IGBT region 10 and the diode region 20 to the termination region 30. On the other hand, the emitter electrode 6 continuous from the cell region and the termination electrode 6a separated from the emitter electrode 6 are provided on the first main surface of the semiconductor substrate in the termination region 30.

The emitter electrode 6 and the termination electrode 6a are electrically connected via a semi-insulating film formation 33. The semi-insulating film 33 may be, for example, sinSiN (semi-insulating silicon nitride film). The termination electrode 6a, the p-type termination well layer 31, and the n⁺ type channel stopper layer 32 are electrically connected via a contact hole formed in the interlayer insulating film 4 provided on the first main surface of the termination region 30. In the termination region 30, a termination protection film 34 is provided to cover the emitter electrode 6, the termination electrode 6a, and the semi-insulating film formation 33. The termination protection film 34 may be formed of, for example, polyimide.

Next, a method for manufacturing the semiconductor device according to the first preferred embodiment will be described. In the following description of the manufacturing method, a method for making the cell region is described, and methods for making the termination region 30, the pad region 40, and the like formed in an arbitrary structure are omitted.

FIGS. 10A to 15B are diagrams illustrating a method for manufacturing a semiconductor device that is an RC-IGBT. FIGS. 10A to 13B are views illustrating a step of forming the front surface side of the semiconductor device 110, and FIGS. 14A and 15B are views illustrating a step of forming the back surface side of the semiconductor device 110.

First, as illustrated in FIG. 10A, a semiconductor substrate constituting the n⁻ type drift layer 1 is prepared. As the semiconductor substrate, for example, a so-called FZ wafer manufactured by a floating zone (FZ) method or a so-called MCZ wafer manufactured by a magnetic field applied Czochralski (MCZ) method may be used, and an n-type wafer containing n-type impurities may be used. The concentration of the n-type impurities contained in the semiconductor substrate is appropriately selected depending on the withstand voltage of the semiconductor device to be manufactured. For example, in a semiconductor device with a withstand voltage of 1200 V, the n-type impurity concentration is adjusted such that the specific resistance of the n⁻ type drift layer 1 constituting the semiconductor substrate is about 40 to 120 Ω·cm. As illustrated in FIG. 10A, in the step of preparing the semiconductor substrate, the entire semiconductor substrate is the n⁻ type drift layer 1, and p-type or n⁻ type impurity ions are implanted from the first main surface side or the second main surface side of such a semiconductor substrate and then diffused into the semiconductor substrate by heat treatment or the like, whereby a p-type or n⁻ type semiconductor layer is formed, and the semiconductor device 110 is manufactured.

As illustrated in FIG. 10A, the semiconductor substrate constituting the n⁻ type drift layer 1 includes regions to be the IGBT region 10 and the diode region 20. Although not illustrated, a region to be the termination region 30 is provided around the regions to be the IGBT region 10 and the diode region 20. Hereinafter, a method for manufacturing the configurations of the IGBT region 10 and the diode region 20 of the semiconductor device 110 will be mainly described, but the termination region 30 of the semiconductor device 110 may be manufactured by a known manufacturing method. For example, when the FLR having a p-type termination well layer 51 as the withstand voltage holding structure is formed in the termination region 30, the FLR may be formed by implanting p-type impurity ions before the processing of the IGBT region 10 and the diode region 20 of the semiconductor device 110, or may be formed by implanting p-type impurity ions simultaneously at the time of implantation of p-type impurities into the IGBT region 10 or the diode region 20 of the semiconductor device 110.

Next, as illustrated in FIG. 10B, n-type impurities such as phosphorus (P) are implanted from the first main surface side of the semiconductor substrate to form the n-type carrier accumulation layer 2. Further, p-type impurities such as boron (B) are implanted from the first main surface side of the semiconductor substrate to form the p-type base layer 15 and the p-type anode layer 25. The n-type carrier accumulation layer 2, the p-type base layer 15, and the p-type anode layer 25 are formed by implanting impurity ions into the semiconductor substrate and then diffusing the impurity ions by heat treatment. The n-type impurities and the p-type impurities are ion-implanted after a masking process is performed on the first main surface of the semiconductor substrate, so that the n-type impurities and the p-type impurities are selectively formed on the first main surface side of the semiconductor substrate. The n-type carrier accumulation layer 2, the p-type base layer 15, and the p-type anode layer 25 are formed in the IGBT region 10 and the diode region 20 and are connected to the p-type termination well layer 51 at the termination region 30. Note that the masking process refers to a process in which a resist is applied on a semiconductor substrate, an opening is formed in a predetermined region of the resist using photolithography, and a mask is formed on the semiconductor substrate in order to perform ion implantation or etching in a predetermined region of the semiconductor substrate through the opening.

The p-type base layer 15 and the p-type anode layer 25 may be formed by simultaneous ion implantation of p-type impurities. In this case, the p-type base layer 15 and the p-type anode layer 25 have the same depth and p-type impurity concentration and have the same configuration. By separately ion-implanting p-type impurities into the p-type base layer 15 and the p-type anode layer 25 by the masking process, the depths and p-type impurity concentrations of the p-type base layer 15 and the p-type anode layer 25 may be made different from each other.

The p-type termination well layer 51 formed in another cross section may be formed by ion-implanting p-type impurities simultaneously with the p-type anode layer 25. In this case, the p-type termination well layer 51 and the p-type anode layer 25 have the same depth and p-type impurity concentration and can be formed to have the same configuration. Also, by forming the p-type termination well layer 51 and the p-type anode layer 25 by simultaneous ion implantation of p-type impurities, the p-type impurity concentrations of the p-type termination well layer 51 and the p-type anode layer 25 can be made different from each other. In this case, one or both of the masks may be used as a mesh-like mask to change the aperture ratio.

By separately ion-implanting p-type impurities into the p-type termination well layer 51 and the p-type anode layer 25 by the masking process, the depths and p-type impurity concentrations of the p-type termination well layer 51 and the p-type anode layer 25 may be made different from each other.

The p-type termination well layer 51, the p-type base layer 15, and the p-type anode layer 25 may be formed by simultaneous ion implantation of p-type impurities.

Next, as illustrated in FIG. 11A, n-type impurities are selectively implanted into the IGBT region 10 on the first main surface side of the p-type base layer 15 by the masking process to form an n⁺ type source layer 13. The n-type impurities to be implanted may be, for example, arsenic (As) or phosphorus (P). Further, by the masking process, p-type impurities are selectively implanted into the IGBT region 10 on the first main surface side of the p-type base layer 15 to form the p⁺ type contact layer 14, and p-type impurities are selectively implanted into the diode region 20 on the first main surface side of the p-type anode layer 25 to form the p⁺ type contact layer 24. The p-type impurities to be implanted may be, for example, boron (B) or aluminum (Al).

Next, as illustrated in FIG. 11B, a trench 8 that penetrates the p-type base layer and the p-type anode layer 25 from the first main surface side of the semiconductor substrate and reaches the n⁻ type drift layer 1 is formed. In the IGBT region 10, the side wall of the trench 8 penetrating the n⁺ type source layer 13 constitutes a part of the n⁺ type source layer 13. The trench 8 may be formed by depositing an oxide film such as SiO₂ on the semiconductor substrate, then forming an opening in the oxide film at a portion where the trench 8 is to be formed by the masking process, and etching the semiconductor substrate using the oxide film with the opening as a mask. In FIG. 12B, the pitch of trenches 8 is the same for the IGBT region 10 and the diode region 20, but the pitch of trenches 8 may be made different for the IGBT region 10 and the diode region 20. The pitch of the trenches 8 can be appropriately changed depending on the mask pattern of the masking process in a plan view.

Figure 12B:
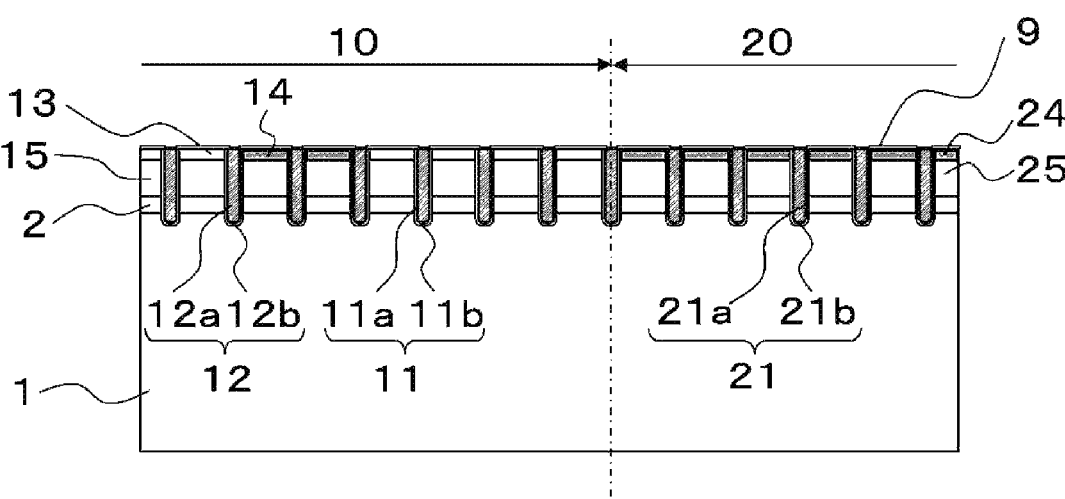

Next, as illustrated in FIG. 12A, the semiconductor substrate is heated in an atmosphere containing oxygen to form an oxide film 9 on the inner wall of the trench 8 and the first main surface of the semiconductor substrate. Of the oxide film 9 formed on the inner wall of the trench 8, the oxide film 9 formed on the trench 8 in the IGBT region 10 is the gate trench insulating film 11b of the active trench gate 11 and the dummy trench insulating film 12b of the dummy trench gate 12. The oxide film 9 formed in the trench 8 in the diode region 20 is the diode trench insulating film 21b. The oxide film 9 formed on the first main surface of the semiconductor substrate is removed in a later step.

Next, as illustrated in FIG. 12B, polysilicon doped with n-type or p-type impurities by chemical vapor deposition (CVD) or the like is deposited in the trench 8 having the oxide film 9 formed on the inner wall to form the gate trench electrode 11a, the dummy trench electrode 12a, and the diode trench electrode 21a.

Next, as illustrated in FIG. 13A, after the interlayer insulating film 4 is formed on the gate trench electrode 11a of the active trench gate 11 in the IGBT region 10, the oxide film 9 formed on the first main surface of the semiconductor substrate is removed. The interlayer insulating film 4 may be, for example, $SiO_2$. Then, a contact hole is formed in the interlayer insulating film 4 deposited by the masking process. The contact holes are formed on the $n^+$ type source layer 13, the $p^+$ type contact layer 14, the $p^+$ type contact layer 24, the dummy trench electrode 12a, and the diode trench electrode 21a.

Next, as illustrated in FIG. 13B, the barrier metal 5 is formed on the first main surface of the semiconductor substrate and the interlayer insulating film 4, and the emitter electrode 6 is further formed on the barrier metal 5. The barrier metal 5 is formed by forming a film of titanium nitride by physical vapor deposition (PVD) or CVD.

The emitter electrode 6 may be formed by depositing an aluminum silicon alloy (Al—Si-based alloy) on the barrier metal 5 by PVD such as sputtering or vapor deposition, for example. A nickel alloy (Ni alloy) may be further formed on the formed aluminum silicon alloy by electroless plating or electrolytic plating to form the emitter electrode 6. When the emitter electrode 6 is formed by plating, a thick metal film can be easily formed as the emitter electrode 6, so that the heat capacity of the emitter electrode 6 can be increased to improve the heat resistance. In a case where a nickel alloy is further formed by plating after the emitter electrode 6 made of an aluminum silicon alloy is formed by PVD, the plating treatment for forming the nickel alloy may be performed after the second main surface side of the semiconductor substrate is processed.

Figure 14A:
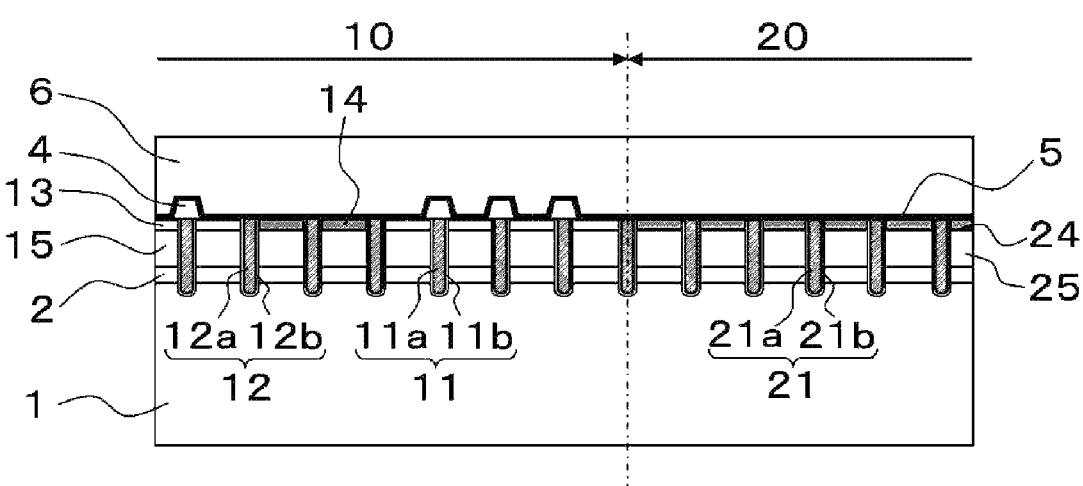

Next, as illustrated in FIG. 14A, the second main surface side of the semiconductor substrate is ground to thin the semiconductor substrate to a designed predetermined thickness. The thickness of the semiconductor substrate after grinding may be, for example, 80 μm to 200 μm.

Figure 14B:
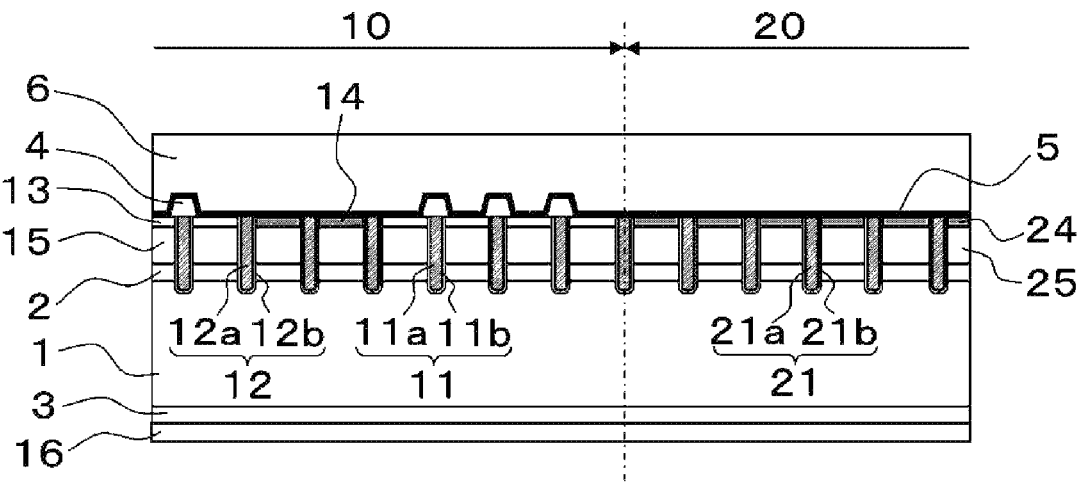

Next, as illustrated in FIG. 14B, n-type impurities are implanted from the second main surface side of the semiconductor substrate to form the n-type buffer layer 3. Furthermore, p-type impurities are implanted from the second main surface side of the semiconductor substrate to form the p-type collector layer 16. The n-type buffer layer 3 may be formed in the IGBT region 10, the diode region 20, and the termination region 30, or may be formed only in the IGBT region 10 or the diode region 20.

The n-type buffer layer 3 may be formed by, for example, implanting phosphorus (P) ions. The formation may be performed by implanting a proton (H+). The formation may be performed by implanting both protons and phosphorus. Protons can be implanted from the second main surface of the semiconductor substrate to a deep position with relatively low acceleration energy. By changing the acceleration energy, the depth at which protons are implanted can be relatively easily changed. Thus, at the time of forming the n-type buffer layer 3 using protons, if protons are implanted a plurality of times while the acceleration energy is changed, it is possible to form an n-type buffer layer 3 wider in the thickness direction of the semiconductor substrate than that formed of phosphorus.

Phosphorus can have a higher activation rate as n-type impurities than protons, so that the punch-through of the depletion layer can be more reliably prevented even in a semiconductor substrate thinned by forming the n-type buffer layer 3 with phosphorus. In order to further thin the semiconductor substrate, it is preferable to form the n-type buffer layer 3 by implanting both protons and phosphorus, and in this case, protons are implanted at a position deeper from the second main surface than phosphorus.

The p-type collector layer 16 may be formed by, for example, implanting boron (B). The p-type collector layer 16 is also formed in the termination region 30, and the p-type collector layer 16 in the termination region 30 becomes the p-type termination collector layer 16a. After ion implantation from the second main surface side of the semiconductor substrate, the second main surface is irradiated with a laser to be laser-annealed, whereby the implanted boron is activated to form the p-type collector layer 16. At this time, phosphorus for the n-type buffer layer 3 implanted at a relatively shallow position from the second main surface of the semiconductor substrate is also activated simultaneously. On the other hand, protons are activated at a relatively low annealing temperature such as 350° C. to 500° C., and hence care needs to be taken to ensure that the temperature of the entire semiconductor substrate does not reach a temperature higher than 350° C. to 500° C. after proton infection except for a step for activating protons. Laser annealing can be used to activate n-type and p-type impurities even after proton implantation because the laser annealing can only raise the temperature near the second main surface of the semiconductor substrate.

Next, as illustrated in FIG. 15A, the $n^+$ type cathode layer 26 is formed in the diode region 20. The $n^+$ type cathode layer 26 may be formed by, for example, implanting phosphorus (P). As illustrated in FIG. 15A, phosphorus is selectively implanted from the second main surface side by the masking process such that the boundary between the p-type collector layer 16 and the $n^+$ type cathode layer 26 is located at a position at a distance U1 from the boundary between the IGBT region 10 and the diode region 20 toward the diode region 20. The implantation amount of n-type impurities for forming the $n^+$ type cathode layer 26 is larger than the implantation amount of p-type impurities for forming the p-type collector layer 16. In FIG. 16A, the depths of the p-type collector layer 16 and the $n^+$ type cathode layer 26 from the second main surface are the same, but the depth of the $n^+$ type cathode layer 26 is equal to or larger than the depth of the p-type collector layer 16. The region where the $n^+$ type cathode layer 26 is formed needs to be made into an n-type semiconductor by implanting n-type impurities into the region where p-type impurities have been implanted, and hence the concentration of the implanted p-type impurities is made higher than the concentration of n-type impurities in the entire region where the n$^+$ type cathode layer 26 is formed.

Next, as illustrated in FIG. 15B, the collector electrode 7 is formed on the second main surface of the semiconductor substrate. The collector electrode 7 is formed over the entire surface of the IGBT region 10, the diode region 20, and the termination region 30 on the second main surface. The collector electrode 7 may be formed over the entire second main surface of the n-type wafer as a semiconductor substrate. The collector electrode 7 may be formed by depositing an aluminum silicon alloy (Ai-Si-based alloy), titanium (Ti), or the like by PVD such as sputtering or vapor deposition or may be formed by laminating a plurality of metals such as an aluminum silicon alloy, titanium, nickel, or gold. Furthermore, a metal film may be further formed on the metal film formed by PVD, by electroless plating or electrolytic plating to form the collector electrode 7.

The semiconductor device 110 is manufactured by the above steps. A plurality of semiconductor devices 110 are produced in a matrix form on one n-type wafer, and the semiconductor devices 110 are thus divided into individual semiconductor devices by laser dicing or blade dicing to complete the semiconductor devices 110.

Next, the operation of the semiconductor device according to the first preferred embodiment will be described.

FIG. 16 is a cross-sectional view illustrating the configuration of the boundary between the IGBT region and the diode region of the semiconductor device according to the first preferred embodiment. FIG. 16 is a cross-sectional view taken along broken line H-H in the semiconductor device 110 illustrated in FIG. 1.

The diode operation of the RC-IGBT will be described. During diode operation, a positive voltage is applied to the emitter electrode 6 compared to the collector electrode 7, and no gate drive voltage is applied to the active trench gate electrode 11a. The application of a positive voltage to the emitter electrode 6 compared to the collector electrode 7 causes holes to flow into the drift layer 1 from the anode layer 25 and the p-type base layer 15, and the inflow holes move toward the cathode layer 26. In the diode region 20a near the boundary with the IGBT region 10a, holes flow from the IGBT region 10a in addition to holes from the anode layer 25, so that the density of holes is higher than that in the diode region 20a away from the IGBT region 10a. During diode operation, a freewheeling current flows in a direction from the emitter electrode 6 toward the collector electrode 7.

As illustrated in FIG. 16, the p-type collector layer 16 provided on the second main surface side of the IGBT region 10a is provided so as to protrude toward the diode region 20a by a distance U1 from the boundary between the IGBT region 10a and the diode region 20a. Although FIG. 16 illustrates the configuration in which the p-type collector layer 16 protrudes by the distance U1 from the boundary between the IGBT region 10a and the diode region 20a on the right side of the paper toward the diode region 20a on the right side of the paper, the p-type collector layer 16 may protrude by the distance U1 from the boundary between the IGBT region 10a and the diode region 20a on the left side of the paper toward the diode region 20a on the left side of the paper. As described above, by providing the p-type termination collector layer 16 so as to protrude toward the diode region 20a, a distance between the n$^+$ type cathode layer 26 in the diode region 20a and the active trench gate 11 can be increased, and even when a gate drive voltage is applied to the active trench gate electrode 11a during diode operation, it is possible to prevent the flow of a current from a channel formed adjacent to the active trench gate 11 in the IGBT region 10a to the n$^+$ type cathode layer 26. The distance U1 may be, for example, 100 μm. Note that the distance U1 may be zero or a distance smaller than 100 μm depending on the application of the semiconductor device 110 being the RC-IGBT. In FIG. 16, the boundary between the IGBT region 10a and the diode region 20a is described, but the same applies to the boundary between the IGBT region 10 (10b, 10c, 10d) and the diode region 20 (20a, 20b, 20c).

The IGBT operation of the RC-IGBT will be described. During the IGBT operation, a negative voltage is applied to the emitter electrode 6 compared to the collector electrode 7, and a gate drive voltage is applied to the active trench gate electrode 11a to partially form an inversion layer of the first conductivity type in the p-type base layer 15 of the second conductivity type, so that electrons flow into the n$^-$ type drift layer 1 from the n$^+$ type source layer 13, and the inflow electrons move toward the p-type collector layer 16. That is, the main current flows in the direction from the collector electrode 16 toward the emitter electrode 6. Note that the holes that have moved toward the n$^+$ type cathode layer 26 at the time of switching to diode operation move, while changing its moving direction, to a direction toward the p-type anode layer 25. That is, a freewheeling current flows in a direction from the emitter electrode 6 toward the collector electrode 7.

While the main current and the freewheeling current flow to generate heat in the semiconductor device, in the RC-IGBT, the diode is the main heat source due to the freewheeling current flowing during the diode operation, and the IGBT is the main heat source due to the main current flowing during the IGBT operation. When the IGBT region 10 and the diode region 20, which are the cell region, are all formed in the same size, the heat dissipation efficiency is all the same in the cell region, resulting in a large temperature rise at the center of the cell region where thermal interference is large. On the other hand, as illustrated in FIG. 1, in the semiconductor device according to the first preferred embodiment, the IGBT region 10a and the diode region 20a are provided at positions closest to the center of the cell region, the IGBT region 10a is a region smaller in size than the peripheral IGBT regions 10b, 10c, 10d, and the diode region 20a is a region smaller in size than the peripheral diode regions 20b, 20c.

Therefore, by dividing the IGBT region and the diode region, which are heat sources at the center of the cell region, into small portions, thermal diffusion not only in the substrate thickness direction but also in the first direction can be promoted, and the heat dissipation from the heat source during the IGBT operation and the diode operation can be improved. As a result, the temperature rise at the center of the cell region can be reduced, and the temperature uniformity of the semiconductor device can be improved. It is sufficient that the IGBT region 10a, which is the smallest of the IGBT regions 10, and the diode region 20a, which is the smallest of the diode regions 20, are provided at the closest position to the center of the cell region, and around the respective regions, the IGBT region 10b or 10c may be the largest of the IGBT regions, and the diode region 20b may be the largest of the diode regions.

A configuration and an operation of a semiconductor device of a comparative example will be described with reference to FIG. 17. When the size of the diode region 20a is larger than that of the IGBT region 10a and the calorific value of the diode region 20a is larger than that of the IGBT region 10a, there is a concern that thermal interference between the regions will become large. While moderate thermal interference promotes thermal diffusion in the first direction and improves heat dissipation, excessive thermal interference leads to heat storage and causes a local temperature rise. Note that the semiconductor device of the comparative example differs from the semiconductor device of the first preferred embodiment in that the size of the IGBT region 10a located between the two diode regions 20a is smaller than that in the semiconductor device 110 of the first preferred embodiment.

When the main current or the freewheeling current flows through each of the IGBT region 10a and the diode region 20a, and the semiconductor device generates heat, the generated heat diffuses in the semiconductor substrate and is dissipated to the outside mainly through the collector electrode 7. As illustrated in FIG. 17, for example, when the diode region 20a on the right side of the paper generates heat, the heat is thermally diffused through the semiconductor substrate in a direction parallel to the surface of the semiconductor substrate such that the heat generated on the surface of the semiconductor substrate has a heat dissipation distance LD1 before reaching the collector electrode 7. At this time, the angle at which heat is diffused is about 45°, and the heat dissipation distance LD1 is substantially equal to the thickness of the semiconductor substrate. When the size of the IGBT region 10a located between the two diode regions 20a is smaller than the heat dissipation distance LD1 described above in a plan view, for example, heat generated from the diode region 20a on the right side of the paper passes through the IGBT region 10a and diffuses to the diode region 20a.

On the other hand, as illustrated in FIG. 16, in the semiconductor device according to the first preferred embodiment, the IGBT region 10a is larger than the substrate thickness in a plan view, so that it is possible to prevent excessive thermal interference between the diode regions 20a adjacent to the IGBT region 10a due to thermal diffusion. In particular, in order to prevent thermal interference from the diode regions 20a located on both sides of the IGBT region 10a, the size of the IGBT region 10a is desirably larger than the heat dissipation distance LD1×2. That is, the thickness being larger than twice the substrate thickness in a plan view enables further prevention of thermal interference. Although the IGBT region 10a is equal to or larger than the thickness of the semiconductor substrate described above, the same applies to the diode region 20a. For example, when the IGBT regions 10a are adjacent to the diode region 20a, excessive thermal interference between the adjacent IGBT regions 10a can be prevented by the fact that the diode region 20a is equal to or larger in thickness than the semiconductor substrate.

FIG. 18 is a cross-sectional view illustrating the configuration of the boundary between the IGBT region and the diode region of the semiconductor device 110 according to the first preferred embodiment and is a cross-sectional view taken along broken line J-J in the semiconductor device 110 illustrated in FIG. 1. As illustrated in FIG. 18, in the semiconductor device of the first preferred embodiment, the IGBT region 10d and the diode region 20c are provided adjacent to each other at a position closest to the end of the cell region. The IGBT region 10d is a region larger in size than the IGBT regions 10a, 10b, 10c and is the largest of the IGBT regions 10. The IGBT region 10a is a region smaller in size than the IGBT regions 10b, 10c, 10d and is the smallest of the IGBT regions 10. As illustrated in FIG. 18, in order to improve the temperature uniformity of the RC-IGBT, it is desirable that 10d, which is the largest of the IGBT regions, be longer than 10a, which is the smallest of the IGBT regions, by the heat dissipation distance LD1 or more. With the IGBT region 10d being larger than the substrate thickness of the IGBT region 10a, for example, thermal diffusion from the diode region 20c to the control pad 41 can be prevented.

In the semiconductor device according to the first preferred embodiment, the IGBT region 10a and the diode region 20a are provided at positions closest to the center of the cell region, the width of the IGBT region 10a in the first direction is equal to or smaller than the widths of the peripheral IGBT regions 10b, 10c, 10d, and the width of the diode region 20a is equal to or smaller than the widths of the peripheral diode regions 20b, 20c. With such a configuration, the thermal interference at the center of the cell region is enhanced compared to the periphery, whereby the heat dissipation can be enhanced, and the temperature rise at the center of the cell can be reduced.

Second Preferred Embodiment

A configuration of a semiconductor device according to a second preferred embodiment will be described with reference to FIG. 2. FIG. 2 is a plan view illustrating the semiconductor device according to the second preferred embodiment. In the second preferred embodiment, the same components as those described in the first preferred embodiment are denoted by the same reference numerals, and description thereof is omitted.

In FIG. 2, the semiconductor device 111 is an island type, and includes IGBT regions 10 (10a, 10b, 10c, 10d, 10e, 10f, 10g) and diode regions 20 (20a, 20b, 20c) in one semiconductor device. The semiconductor device 110 according to the first preferred embodiment illustrated in FIG. 1 has a stripe shape in which the IGBT regions 10 and the diode regions 20 are alternately arranged linearly in the direction orthogonal to the extending direction of the IGBT region 10 and the diode region 20. However, in the semiconductor device 111 according to the second preferred embodiment illustrated in FIG. 2, although the stripe of the IGBT regions 10 (10a, 10b, 10c, 10d) is maintained, the stripe portion of the diode region 20 is divided into a plurality of regions by the IGBT region 10, and the plurality of diode regions 20 are arranged in an island shape, each of which is arranged to be covered by a continuous IGBT region 10. Such an island-like arrangement is also called an island-type semiconductor device or the like. In the island-type semiconductor device as well, a region in which the IGBT regions 10 and the diode regions 20 are alternately arranged linearly is referred to as an alternating region. For example, the island-type semiconductor device has an alternating region in which the IGBT regions 10 and the diode regions 20 are alternately arranged linearly on an imaginary line including an H-H cross section and further extending the H-H cross section.

In the semiconductor device 110, the IGBT region 10c and the IGBT region 10d are connected by the IGBT region 10g, and the IGBT region 10g is disposed alternately with the diode regions 20c in the direction in which the IGBT region 10c extends. The IGBT region 10b and the IGBT region 10c are connected by the IGBT region 10f, and the IGBT region 10f is alternately disposed linearly with the diode regions 20b in the direction in which the IGBT region 10b extends. The IGBT region 10a and the IGBT region 10b are connected by the IGBT region 10e, and the IGBT region 10e is disposed alternately with the diode regions 20a in a direction in which the IGBT region 10a extends.

As illustrated in FIG. 2, in the semiconductor device 111, the IGBT region 10*a* and the diode region 20*a* are provided at positions closest to the center of the cell region, the IGBT region 10*a* is a region having a smaller width W1*a* in the first direction along the alternating region than the peripheral IGBT regions 10*b*, 10*c*, 10*d*, and the diode region 20*a* is a region having a smaller width W2*a* in the first direction than the peripheral diode regions 20*b*, 20*c*. With such a configuration, the heat dissipation at the center of the cell region is enhanced compared to the periphery, whereby the temperature rise at the center can be reduced.

Figure 19:
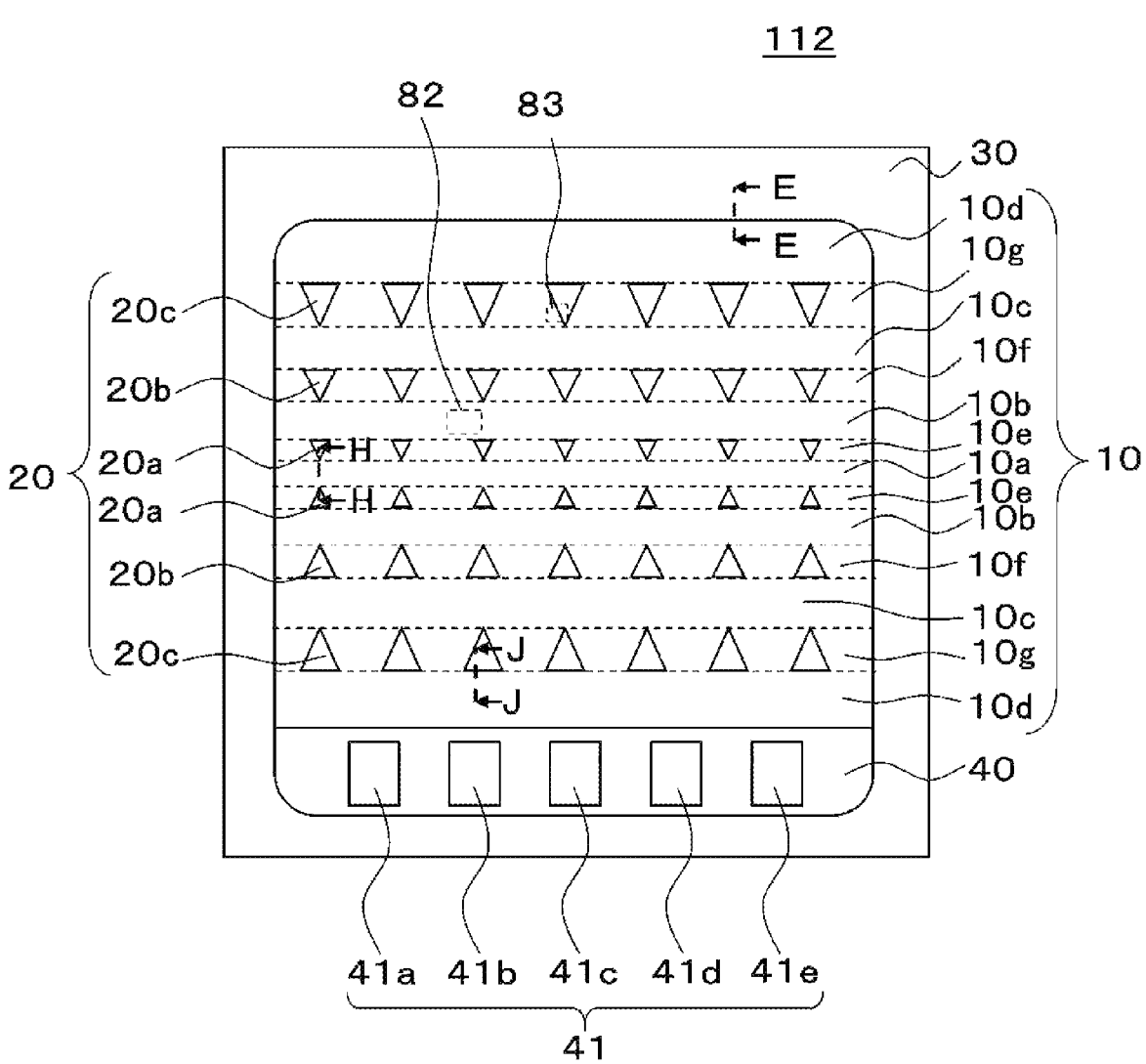

As another modification of the second preferred embodiment, as illustrated in FIGS. 19 and 20, the diode region 20 may have a triangular shape or a circular shape, and may have a polygonal shape, such as a triangular shape, an elliptical shape, or the like as long as having an island shape. In addition, as illustrated in FIG. 19, the vertex of the triangle may be set to face the center of the cell region, and the width in a direction parallel to the bottom surface of the triangle is set to become smaller from the end side of the cell region toward the center of the cell region, so that the thermal resistance at the center of the cell region can be lowered compared to the periphery to reduce the temperature rise at the center and improve the temperature uniformity of the cell region.

In FIGS. 2, 19, and 20, the diode region 20 is provided in an island shape, but the IGBT region 10 may be provided in an island shape, and it is sufficient that either the diode region 20 or the IGBT region 10 is provided in an island shape. Note that the number of diode regions 20 only need be two or more types and is not limited to the number illustrated in FIGS. 2, 19, and 20. In addition to the symmetrical arrangement centered on a specific position, the arrangement may be asymmetrical arrangement as long as making the temperature of the cell region uniform. The IGBT regions 10 and the diode regions 20 may be provided such that the area is the smallest at the center of the cell region and the area gradually increases from the center to the end of the cell region, and by lowering the thermal resistance at the center of the cell region compared to the periphery, the temperature rise at the center of the cell region can be reduced, and the heat dissipation property can be improved.

Therefore, in the second preferred embodiment, either the IGBT region 10 or the diode region 20 has an island shape, the width of the IGBT region 10*a* in the first direction is equal to or smaller than the width of the peripheral IGBT regions 10*b*, 10*c*, 10*d*, and the width of the diode region 20*a* is equal to or smaller than the width of the peripheral diode regions 20*b*, 20*c*. With such a configuration, the thermal interference at the center of the cell region is enhanced compared to the periphery, whereby the heat dissipation can be enhanced, and the temperature rise at the center of the cell can be reduced.

Third Preferred Embodiment

Figure 21:
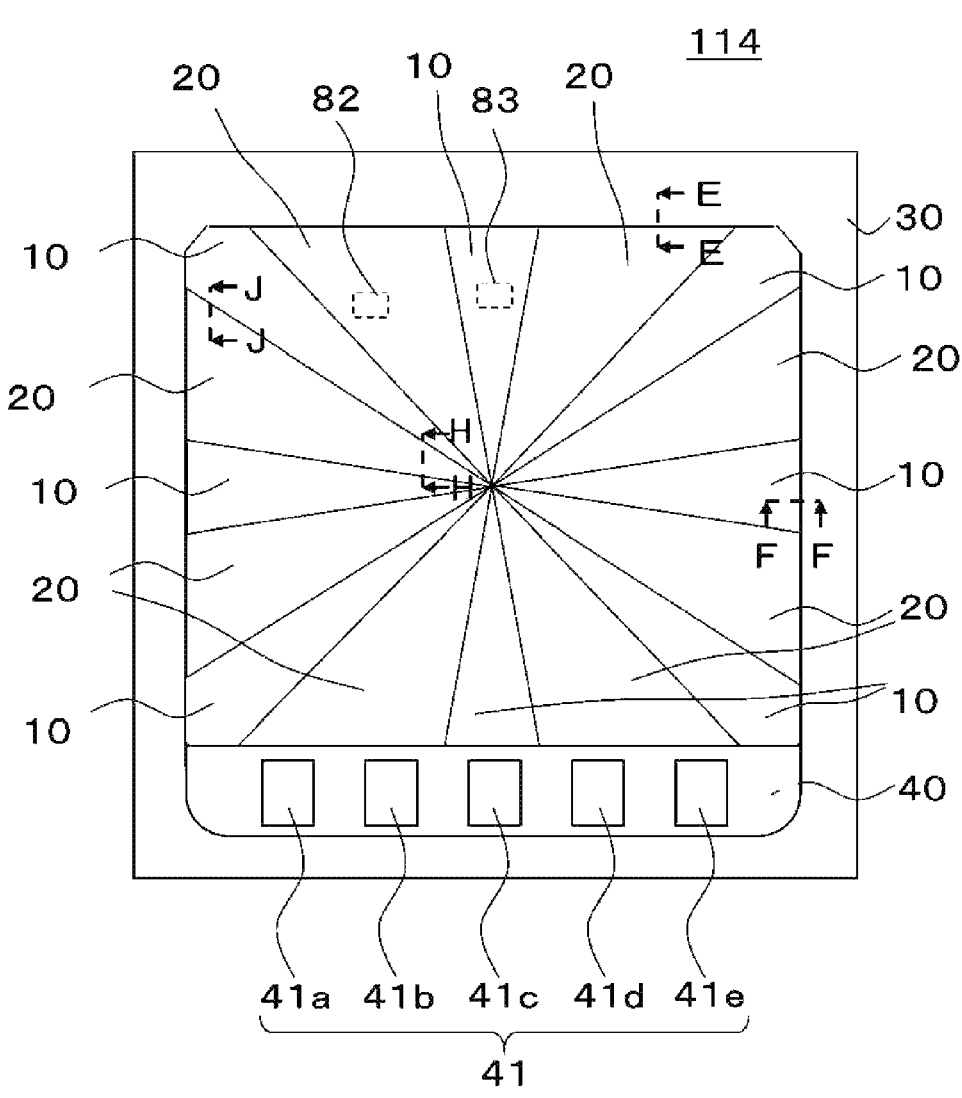
FIG. 21 is a plan view illustrating a semiconductor device according to a third preferred embodiment.

A configuration of a semiconductor device according to a third preferred embodiment will be described with reference to FIG. 21. FIG. 21 is a plan view illustrating the semiconductor device according to the third preferred embodiment. In the third preferred embodiment, the same components as those described in the first to second preferred embodiments are denoted by the same reference numerals, and the description thereof is omitted. Note that descriptions of the H-H cross section and the J-J cross section illustrated in FIG. 21 are similar to those of the other preferred embodiments and are thus omitted.

As illustrated in FIG. 21, in a semiconductor device 114, the IGBT regions 10 and the diode regions 20, which are the cell region, are alternately and radially arranged from the center of the cell region toward the end of the cell region. With such a configuration, the width is small at the center of the IGBT regions 10 and the diode regions 20 and becomes larger toward the end. Therefore, by lowering the thermal resistance at the center of the cell region compared to the periphery, the temperature rise at the center can be reduced, and the temperature uniformity of the cell region can be improved. As illustrated in FIG. 21, the widths of the plurality of IGBT regions 10 at the end of the cell region of the IGBT region are the same, but the widths of the plurality of IGBT regions at the end of the cell region may be different from each other, and the same applies to the diode regions 20.

The semiconductor device according to the third preferred embodiment has, for example, an alternating region in which the IGBT regions 10 and the diode regions 20 are alternately arranged linearly on an imaginary line including the H-H cross section and further extending the H-H cross section. In the alternating region, the width, in the first direction along the alternating region, of the IGBT region closest to the center of the cell region is equal to or smaller than the widths of the other IGBT regions in the first direction, and the width, in the first direction, of the diode region closest to the center of the cell region is equal to or smaller than the widths of the other diode regions in the first direction.

Therefore, the third preferred embodiment has a structure in which the IGBT regions 10 and the diode regions 20, which are the cell region, are alternately and radially arranged from the center of the cell region toward the end of the cell region, the width is small at the center of the IGBT region 10 and the diode region 20, and becomes larger toward the end. In the alternating region, the width, in the first direction along the alternating region, of the IGBT region closest to the center of the cell region is equal to or smaller than the width of the other IGBT region in the first direction, and the width, in the first direction, of the diode region closest to the center of the cell region is equal to or smaller than the widths of the other diode regions in the first direction. With such a configuration, the thermal interference at the center of the cell region is enhanced compared to the periphery, whereby the heat dissipation can be enhanced, and the temperature rise at the center of the cell can be reduced.

Fourth Preferred Embodiment

A configuration of a semiconductor device according to a fourth preferred embodiment will be described with reference to FIG. 22. FIG. 22 is a plan view illustrating the semiconductor device according to the fourth preferred embodiment. In the fourth preferred embodiment, the same components as those described in the first to third preferred embodiments are denoted by the same reference numerals, and description thereof is omitted.

As illustrated in FIG. 22, a semiconductor device 115 is a semiconductor device in which the outer peripheries of the IGBT region 10 and the diode region 20 are quadrangular, the quadrangular shapes are concentric quadrangular shapes having the same center, and the quadrangular shapes are alternately provided from the center of the quadrangular shape, that is, the concentric position, toward the end of the cell region. Note that the center of the concentric quadrangular shape does not necessarily need to coincide with the center of the cell region and only need be set in the cell region, and the width of each region only need be larger from the center of the concentric quadrangular shape toward the end of the cell region. Note that the outer periphery of each of the IGBT region 10 and the diode region 20 may have a polygonal shape or a circular shape other than the quadrangular shape.

The IGBT regions 10 and the diode regions 20 are alternately arranged in a concentric quadrangular shape, and the concentric quadrangular shape is disposed in the cell region. The central region has an island shape, and the other regions are provided in an annular shape. The IGBT regions 10 and the diode regions 20 each having an outer periphery in a concentric quadrangular shape are provided in a concentric quadrangular shape such that the width is the smallest at the center of the cell region and becomes larger toward the end of the cell region. That is, a width W1$a$ of the IGBT region 10$a$ is equal to or smaller than the widths of the peripheral IGBT regions 10$b$, 10$c$, 10$d$, and a width W2$a$ of the diode region 20$a$ is equal to or smaller than the widths of the peripheral diode regions 20$b$, 20$c$.

With such a configuration, the thermal interference at the center of the cell region is enhanced compared to the periphery, whereby the temperature rise at the center of the cell can be reduced, and the temperature uniformity of the cell region can be improved. As illustrated in FIG. 23 as another modification of the fourth preferred embodiment, the diode regions 20 may be interspersed in a concentric rectangular region indicated by a dotted line, and the IGBT regions 10$a$, 10$b$, 10$c$, 10$d$ may be connected by the IGBT regions 10$e$, 10$f$, 10$g$, respectively.

For example, the concentric rectangular IGBT region 10$c$ and the concentric rectangular IGBT region 10$d$ are connected by the IGBT region 10$g$, and the IGBT region 10$g$ is disposed alternately with the diode region 20$c$ interspersed in the concentric rectangular shape. The concentric rectangular IGBT region 10$b$ and the concentric rectangular IGBT region 10$c$ are connected by the IGBT region 10$f$, and the IGBT region 10$f$ is disposed alternately with the diode region 20$b$ interspersed in the concentric rectangular shape. The IGBT region 10$a$, which is an island, and the concentric rectangular IGBT region 10$b$ are connected by the IGBT region 10$e$, and the IGBT region 10$e$ is disposed alternately with the diode regions 20$a$ interspersed in the concentric rectangular shape. Note that the concentric quadrangular shape may be a round concentric quadrangular shape having a curvature at its corners. In other words, in the plurality of diode regions 20 provided in an island shape, when an imaginary line connecting adjacent island-shaped regions is drawn along the end of the cell region, a plurality of imaginary lines can be drawn, and the plurality of imaginary lines have a concentric quadrangular shape having a center in the cell region. For example, a first island group including a plurality of island-shaped diode regions 20$a$ arranged away from the end of the annular cell region by a first distance is surrounded by a first imaginary line annularly connecting imaginary lines drawn in contact with portions of the diode regions 20$a$ closest to the end of the cell region and a second imaginary line annularly connecting imaginary lines drawn in contact with portions of the diode regions 20$a$ farthest from the end of the cell region. A second island group including a plurality of island-shaped diode regions 20$b$ arranged away from the end of the annular cell region by a second distance is surrounded by a third imaginary line annularly connecting imaginary lines drawn in contact with portions of the diode regions 20$b$ closest to the end of the cell region and a fourth imaginary line annularly connecting imaginary lines drawn in contact with portions of the diode regions 20$b$ farthest from the end of the cell region. The third island group including the plurality of island-shaped diode regions 20$c$ arranged away from the end of the annular cell region by a third distance is surrounded by a fifth imaginary line annularly connecting imaginary lines drawn in contact with portions of the diode regions 20$c$ closest to the end of the cell region and a sixth imaginary line annularly connecting imaginary lines drawn in contact with portions of the diode regions 20$c$ farthest from the end of the cell region. A region surrounded by the first imaginary line and the second imaginary line, a region surrounded by the third imaginary line and the fourth imaginary line, and a region surrounded by the fifth imaginary line and the sixth imaginary line have the same center. Although three types of island groups are described, two or more types only need be used.

Furthermore, as illustrated in FIGS. 24 and 25, the diode region 20 may have a triangular shape or a circular shape, and may have a polygonal shape such as a triangular shape, an elliptical shape, or the like as long as having an island shape. In addition, as illustrated in FIG. 24, the vertex of the triangle may be set to face the center of the cell region, and the width in a direction parallel to the bottom surface of the triangle is set to become smaller from the end side of the cell region toward the center of the cell region, so that the thermal resistance at the center of the cell region can be lowered compared to the periphery to reduce the temperature rise at the center and improve the temperature uniformity of the cell region. In FIGS. 22 to 25, the diode region 20 is provided in an island shape, but the IGBT region 10 may be provided in an island shape, and it is sufficient that either the diode region 20 or the IGBT region 10 is provided in an island shape.

Note that the number of diode regions 20 only need be two or more types and is not limited to the number illustrated in FIGS. 22 to 25. In addition to the symmetrical arrangement centered on a specific position, the arrangement may be asymmetrical arrangement as long as making the temperature of the cell region uniform. The IGBT regions 10 and the diode regions 20 may be provided such that the area is the smallest at the center of the cell region and the area gradually increases from the center to the end of the cell region, and by lowering the thermal resistance at the center of the cell region compared to the periphery, the temperature rise at the center of the cell region can be reduced, and the heat dissipation property can be improved.

The semiconductor device according to the fourth preferred embodiment has, for example, an alternating region in which the IGBT regions 10 and the diode regions 20 are alternately arranged linearly on an imaginary line including the H-H cross section and further extending the H-H cross section. In the alternating region, the width, in the first direction along the alternating region, of the IGBT region closest to the center of the cell region is equal to or smaller than the widths of the other IGBT regions in the first direction, and the width, in the first direction, of the diode region closest to the center of the cell region is equal to or smaller than the widths of the other diode regions in the first direction.

Thus, in the fourth preferred embodiment, the IGBT regions 10 and the diode regions 20 are alternately arranged in a concentric quadrangular shape centered on the center of the cell region, and the IGBT regions 10 and the diode regions 20 are provided in a concentric quadrangular shape such that the width is small at the center of the cell region and becomes larger toward the end of the cell region. Therefore, by lowering the thermal resistance at the center of the cell region compared to the periphery, the temperature rise at the center can be reduced, and the heat dissipation can be improved.

In the fourth preferred embodiment, the configuration has been described in which the IGBT region 10 and the diode region 20 are provided in a concentric quadrangular shape as illustrated in FIG. 22. However, each of the IGBT region 10 and the diode region 20 does not need to have a quadrangular shape as long as they are concentric, and may have a polygonal shape such as a triangular shape or an octagonal shape, or may have a circular shape.

Fifth Preferred Embodiment

In the present preferred embodiment, any one of the semiconductor devices according to the first to fourth preferred embodiments described above is applied to a power conversion apparatus. Although the present disclosure is not limited to a specific power conversion apparatus, a case where the present disclosure is applied to a three-phase inverter will be described below as a fifth preferred embodiment.

FIG. 26 is a block diagram illustrating a configuration of a power conversion system to which the power conversion apparatus according to the present preferred embodiment has been applied.

The power conversion system illustrated in FIG. 26 includes a power supply 100, a power conversion apparatus 200, and a load 300. The power supply 100 is a DC power supply and supplies DC power to the power conversion apparatus 200. The power supply 100 can be formed of various components, can be formed of, for example, a DC system, a solar cell, or a storage battery, and may be formed of a rectifier circuit or an AC/DC converter connected to an AC system. The power supply 100 may be formed of a DC/DC converter that converts DC power output from the DC system into predetermined power.

The power conversion apparatus 200 is a three-phase inverter connected between the power supply 100 and the load 300, converts DC power supplied from the power supply 100 into AC power, and supplies the AC power to the load 300. As illustrated in FIG. 26, the power conversion apparatus 200 includes a main conversion circuit 201 that converts DC power into AC power and outputs the AC power, a drive circuit 202 that outputs a drive signal for driving each switching element of the main conversion circuit 201, and a control circuit 203 that outputs a control signal for controlling the drive circuit 202 to the drive circuit 202.

The load 300 is a three-phase electric motor driven by the AC power supplied from the power conversion apparatus 200. Note that the load 300 is not limited to a specific application but is an electric motor mounted on various electric devices and is used as an electric motor for, for example, a hybrid vehicle, an electric vehicle, a railway vehicle, an elevator, or air conditioning equipment.

Hereinafter, details of the power conversion apparatus 200 will be described. The main conversion circuit 201 includes a switching element (not illustrated), converts DC power supplied from the power supply 100 into AC power by switching of the switching element, and supplies the AC power to the load 300. Although there are various specific circuit configurations of the main conversion circuit 201, the main conversion circuit 201 according to the present preferred embodiment is a two-level three-phase full bridge circuit and can include six switching elements. For each switching element of the main conversion circuit 201, the semiconductor device according to any one of the first to fourth preferred embodiments described above is applied. The six switching elements are connected in series for every two switching elements to form upper and lower arms, and each upper and lower arm constitutes each phase (U-phase, V-phase, W-phase) of the full bridge circuit. The output terminals of the upper and lower arms, that is, the three output terminals of the main conversion circuit 201, are connected to the load 300.

The drive circuit 202 generates a drive signal for driving the switching element of the main conversion circuit 201 and supplies the drive signal to the control electrode of the switching element of the main conversion circuit 201. Specifically, in accordance with a control signal from the control circuit 203 to be described later, a drive signal for turning on the switching element and a drive signal for turning off the switching element are output to the control electrode of each switching element. When the switching element is held in an on-state, the drive signal is a voltage signal (on-signal) equal to or higher than the threshold voltage of the switching element, and when the switching element is held in an off-state, the drive signal is a voltage signal (off-signal) equal to or lower than the threshold voltage of the switching element.

The control circuit 203 controls the switching elements of the main conversion circuit 201 so that desired power is supplied to the load 300. Specifically, a time (on-time) at which each switching element of the main conversion circuit 201 is to be turned on is calculated based on the power to be supplied to the load 300. For example, the main conversion circuit 201 can be controlled by PWM control that modulates the on-time of the switching element in accordance with the voltage to be output. Then, a control command (control signal) is output to the drive circuit 202 so that an on-signal is output to the switching element to be turned on at each time point, and an off-signal is output to the switching element to be turned off at each time point. In accordance with this control signal, the drive circuit 202 outputs an on-signal or an off-signal as a drive signal to the control electrode of each switching element.

In the power conversion apparatus according to the present preferred embodiment, any one of the semiconductor devices according to the first to fourth preferred embodiments is applied as the switching element of the main conversion circuit 201, so that it is possible to reduce the temperature rise at the center of the cell region and to improve the heat dissipation by lowering the thermal resistance at the center of the cell region compared to the periphery.

In the present preferred embodiment, the example has been described in which the present disclosure is applied to the two-level three-phase inverter, but the present disclosure is not limited thereto and can be applied to various power conversion apparatuses. The power conversion apparatus is the two-level power conversion apparatus in the present preferred embodiment, but the power conversion apparatus may be a three-level or multi-level power conversion apparatus, or when electric power is to be supplied to a single-phase load, the present disclosure may be applied to a single-phase inverter. When electric power is to be supplied to a DC load or the like, the present disclosure can also be applied to a DC/DC converter or an AC/DC converter.

Further, the power conversion apparatus to which the present disclosure has been applied is not limited to the above-described case where the load is the electric motor, but may be used as, for example, a power supply device of an electric discharge machine, a laser processing machine, an induction heating cooker, or a non-contact power supply system, and can also be used as a power conditioner of a photovoltaic power generation system, a power storage system, or the like.

In the above preferred embodiment, the switching element is formed of silicon, but the switching element may be formed of a wide band gap semiconductor having a larger band gap than silicon. Examples of the wide band gap semiconductor include silicon carbide, a gallium nitride-based material, and diamond.

The switching element formed of the wide band gap semiconductor as thus described has high withstand voltage and high allowable current density, and it is possible to downsize the switching element. By using these downsized switching elements, it is possible to downsize a semiconductor module incorporating these elements.

Further, the heat resistance is high, making it possible to downsize the heat dissipation fin of the heat sink and air-cool the water-cooling unit, and thereby to further downsize the semiconductor device.

Moreover, the power loss is low, making it possible to increase the efficiency of the switching element, and in turn, possible to increase the efficiency of the semiconductor device.

Although some preferred embodiments of the present disclosure have been described, these preferred embodiments have been presented by way of example. Various omissions, substitutions, and changes can be made without departing from the gist thereof. Further, the preferred embodiments can be combined.

Hereinafter, various aspects of the present disclosure will be collectively described as appendixes.

(Appendix 1)

A semiconductor device including a semiconductor substrate that has a drift layer of a first conductivity type between a first main surface and a second main surface opposite to the first main surface, the semiconductor device including:

insulated gate bipolar transistor (IGBT) regions each including a trench gate provided to penetrate an emitter layer of the first conductivity type and a base layer of a second conductivity type from the first main surface of the semiconductor substrate, and a collector layer of the second conductivity type provided closer to the second main surface than the drift layer;

diode regions each including an anode layer of the second conductivity type provided closer to the first main surface than the drift layer and a cathode layer of the first conductivity type provided closer to the second main surface than the drift layer; and a cell region including an alternating region that includes the IGBT regions and the diode regions and in which the IGBT regions and the diode regions are alternately arranged linearly in a plan view, wherein in a first direction along the alternating region, a width of each of the IGBT regions and a width of each of the diode regions are not constant and are set so as to be two or more types of widths, and in the alternating region, a width, in the first direction, of the IGBT region closest to a center of the cell region is equal to or smaller than widths of other IGBT regions in the first direction, and a width, in the first direction, of the diode region closest to the center of the cell region is equal to or smaller than widths of other diode regions in the first direction.

(Appendix 2)

The semiconductor device according to Appendix 1, wherein in the alternating region, the width of the IGBT region in the first direction gradually increases from the IGBT region closest to the center of the cell region toward the IGBT region closest to an end of the cell region in the first direction.

(Appendix 3)

The semiconductor device according to Appendixes 1 or 2, wherein in the alternating region, the width of the diode region in the first direction gradually increases from the diode region closest to the center of the cell region toward the diode region closest to the end of the cell region in the first direction.

(Appendix 4)

The semiconductor device according to Appendix 1, wherein in the alternating region, a width, in the first direction, of another IGBT region excluding the IGBT region closest to the center of the cell region and the IGBT region closest to an end of the cell region in the first direction is the largest of the widths of the IGBT regions in the first direction, and a width, in the first direction, of another diode region excluding the diode region closest to the center of the cell region and the diode region closest to the end of the cell region in the first direction is the largest of the widths of the diode regions in the first direction.

(Appendix 5)

The semiconductor device according to any one of Appendixes 1 to 4, wherein in the alternating region, the width, in the first direction, of the IGBT region closest to the center of the cell region is equal to or larger than a thickness of the semiconductor substrate.

(Appendix 6) The semiconductor device according to any one of Appendixes 1 to 5, wherein in the alternating region, the width, in the first direction, of the diode region closest to the center of the cell region is equal to or larger than a thickness of the semiconductor substrate.

(Appendix 7)

The semiconductor device according to any one of Appendixes 1 to 6, wherein the IGBT regions and the diode regions are provided to extend in a direction orthogonal to the first direction and are alternately provided along the first direction in the alternating region.

(Appendix 8)

The semiconductor device according to any one of Appendixes 1 to 6, wherein the IGBT regions and the diode regions are provided radially such that the width in the first direction increases from the center of the cell region toward the end of the cell region.

(Appendix 9)

The semiconductor device according to any one of Appendixes 1 to 6, wherein in a plan view, an outer periphery of each of the IGBT regions and the diode regions has a polygonal shape or a circular shape, the polygonal shape or the circular shape of each of the IGBT regions and the diode regions has an identical center, and the IGBT region and the diode region are alternately provided from the identical center toward the end of the cell region.

(Appendix 10) The semiconductor device according to any one of Appendixes 1 to 6, wherein one of the IGBT region and the diode region is provided to be divided into a plurality of island-shaped regions surrounded by the other region in a plan view.

(Appendix 11)

The semiconductor device according to Appendix 10, wherein each of the island-shaped regions is provided in a polygonal shape or a circular shape in a plan view.

(Appendix 12)

The semiconductor device according to Appendixes 10 or 11, further including:

a first island group including a plurality of the island-shaped regions arranged away from the end of the cell region having an annular shape by a first distance;

a second island group including a plurality of the island-shaped regions arranged away from the end of the cell region having the annular shape by a second distance;

a first imaginary line annularly connecting imaginary lines drawn in contact with portions, closest to the end of the cell region, of the island-shaped regions belonging to the first island group;

a second imaginary line annularly connecting imaginary lines drawn in contact with portions, farthest from the end of the cell region, of the island-shaped regions belonging to the first island group;

a third imaginary line annularly connecting imaginary lines drawn in contact with portions, closest to the end of the cell region, of the island-shaped regions belonging to the second island group; and a fourth imaginary line annularly connecting imaginary lines drawn in contact with portions, farthest from the end of the cell region, of the island-shaped regions belonging to the second island group, wherein a region surrounded by the first imaginary line and the second imaginary line and a region surrounded by the third imaginary line and the fourth imaginary line have an identical center.

(Appendix 13)

A power conversion apparatus including a main conversion circuit that includes the semiconductor device according to any one of Appendixes 1 to 12 and converts input electric power to output the electric power converted;

a drive circuit that outputs to the semiconductor device a drive signal for driving the semiconductor device; and a control circuit that outputs to the drive circuit a control signal for controlling the drive circuit.

While the disclosure has been shown and described in detail, the foregoing description is in all aspects illustrative and not restrictive. It is therefore understood that numerous modifications and variations can be devised.

What is claimed is:

1. A semiconductor device comprising a semiconductor substrate that has a drift layer of a first conductivity type between a first main surface and a second main surface opposite to the first main surface, the semiconductor device comprising:

insulated gate bipolar transistor (IGBT) regions each including a trench gate provided to penetrate an emitter layer of the first conductivity type and a base layer of a second conductivity type from the first main surface of the semiconductor substrate, and a collector layer of the second conductivity type provided closer to the second main surface than the drift layer;

diode regions each including an anode layer of the second conductivity type provided closer to the first main surface than the drift layer and a cathode layer of the first conductivity type provided closer to the second main surface than the drift layer; and a cell region including an alternating region that includes the IGBT regions and the diode regions and in which the IGBT regions and the diode regions are alternately arranged linearly in a plan view, wherein in a first direction along the alternating region, a width of each of the IGBT regions and a width of each of the diode regions are not constant and are set so as to be two or more types of widths, and in the alternating region, a width in the first direction of the IGBT region closest to a center of the cell region is smaller than widths of other IGBT regions in the first direction, and a width in the first direction of the diode region closest to the center of the cell region is smaller than widths of other diode regions in the first direction.

2. The semiconductor device according to claim 1, wherein, in the alternating region, the width of the IGBT region in the first direction gradually increases from the IGBT region closest to the center of the cell region toward the IGBT region closest to an end of the cell region in the first direction.

3. The semiconductor device according to claim 1, wherein, in the alternating region, the width of the diode region in the first direction gradually increases from the diode region closest to the center of the cell region toward the diode region closest to an end of the cell region in the first direction.

4. The semiconductor device according to claim 1, wherein in the alternating region, a width, in the first direction, of another IGBT region excluding the IGBT region closest to the center of the cell region and the IGBT region closest to an end of the cell region in the first direction is the largest of the widths of the IGBT regions in the first direction, and a width, in the first direction, of another diode region excluding the diode region closest to the center of the cell region and the diode region closest to the end of the cell region in the first direction is the largest of the widths of the diode regions in the first direction.

5. The semiconductor device according to claim 1, wherein, in the alternating region, the width in the first direction of the IGBT region closest to the center of the cell region is equal to or larger than a thickness of the semiconductor substrate.

6. The semiconductor device according to claim 1, wherein in the alternating region, the width in the first direction of the diode region closest to the center of the cell region is equal to or larger than a thickness of the semiconductor substrate.

7. The semiconductor device according to claim 1, wherein the IGBT regions and the diode regions are provided to extend in a direction orthogonal to the first direction and are alternately provided along the first direction in the alternating region.

8. The semiconductor device according to claim 1, wherein the IGBT regions and the diode regions are provided radially such that the width in the first direction increases from the center of the cell region toward an end of the cell region.

9. The semiconductor device according to claim 1, wherein, in a plan view, an outer periphery of each of the IGBT regions and the diode regions has a polygonal shape or a circular shape, the polygonal shape or the circular shape of each of the IGBT regions and the diode regions has an identical center, and the IGBT region and the diode region are alternately provided from the identical center toward an end of the cell region.

10. The semiconductor device according to claim 1, wherein one of the IGBT region and the diode region is provided to be divided into a plurality of island-shaped regions surrounded by the other region in a plan view.

11. The semiconductor device according to claim 10, wherein each of the island-shaped regions is provided in a polygonal shape or a circular shape in a plan view.

12. The semiconductor device according to claim 10, further comprising:

a first island group including a plurality of the island-shaped regions arranged away from an end of the cell region having an annular shape by a first distance;

a second island group including a plurality of the island-shaped regions arranged away from the end of the cell region having the annular shape by a second distance;

a first imaginary line annularly connecting imaginary lines drawn in contact with portions, closest to the end of the cell region, of the island-shaped regions belonging to the first island group;

a second imaginary line annularly connecting imaginary lines drawn in contact with portions, farthest from the end of the cell region, of the island-shaped regions belonging to the first island group;

a third imaginary line annularly connecting imaginary lines drawn in contact with portions, closest to the end of the cell region, of the island-shaped regions belonging to the second island group; and a fourth imaginary line annularly connecting imaginary lines drawn in contact with portions, farthest from the end of the cell region, of the island-shaped regions belonging to the second island group, wherein a region surrounded by the first imaginary line and the second imaginary line and a region surrounded by the third imaginary line and the fourth imaginary line have an identical center.

13. A power conversion apparatus comprising:

a main conversion circuit that includes the semiconductor device according to claim 1 and converts input electric power to output the electric power converted;

a drive circuit that outputs to the semiconductor device a drive signal for driving the semiconductor device; and a control circuit that outputs to the drive circuit a control signal for controlling the drive circuit.

14. The semiconductor device according to claim 1, wherein, in the first direction along the alternating region, widths of each of the diode regions are not constant and are set so as to be two or more types of widths.

15. The semiconductor device according to claim 1, wherein, at least two of the IGBT regions have different widths in the first direction, and at least two of the diode regions have different widths in the first direction.

* * * * *